(12) United States Patent
Ni et al.

(10) Patent No.: US 12,176,803 B2
(45) Date of Patent: Dec. 24, 2024

(54) DECOUPLING DEVICE USING STORED CHARGE REVERSE RECOVERY

(71) Applicant: Apple Inc., Cupertino, CA (US)

(72) Inventors: Chi Nung Ni, Foster City, CA (US); Sanjay Dabral, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/471,868

(22) Filed: Sep. 21, 2023

(65) Prior Publication Data

US 2024/0088779 A1  Mar. 14, 2024

Related U.S. Application Data

(63) Continuation of application No. 17/485,022, filed on Sep. 24, 2021, now Pat. No. 11,811,303.

(51) Int. Cl.
*H02M 1/15* (2006.01)
*G06F 1/3206* (2019.01)
*H02M 3/158* (2006.01)

(52) U.S. Cl.
CPC ............ *H02M 1/15* (2013.01); *G06F 1/3206* (2013.01); *H02M 3/1582* (2013.01)

(58) Field of Classification Search
CPC ...... H02M 1/15; H02M 3/1582; G06F 1/3206
See application file for complete search history.

(56) References Cited

U.S. PATENT DOCUMENTS

| | | | |
|---|---|---|---|
| 9,548,732 B2* | 1/2017 | Sicard | H02M 7/538 |
| 10,879,885 B2* | 12/2020 | Lenz | H02M 3/158 |
| 2011/0050173 A1 | 3/2011 | King et al. | |
| 2012/0133205 A1 | 5/2012 | Adams et al. | |
| 2016/0211675 A1 | 7/2016 | Joehren et al. | |
| 2017/0205480 A1 | 7/2017 | George | |
| 2020/0025847 A1 | 1/2020 | Verghese | |
| 2020/0304112 A1 | 9/2020 | Zhang et al. | |

* cited by examiner

*Primary Examiner* — Jue Zhang
*Assistant Examiner* — Afework S Demisse
(74) *Attorney, Agent, or Firm* — Kowert, Hood, Munyon, Rankin & Goetzel, P.C.; Dean M. Munyon

(57) ABSTRACT

Increases in current drawn from power supply nodes in a computer system can result in unwanted drops in the voltages of the power supply nodes until power supply circuits can compensate for the increased load. To lessen the effects of increases in load currents, a decoupling circuit that includes a diode may be coupled to the power supply node. During a charge mode, a control circuit applies a current to the diode to store charge in the diode. During a boost mode, the control circuit can couple the diode to the power supply node. When the voltage level of the power supply node begins to drop, the diode can source a current to the power supply node using the previously stored charge. The diode may be directly coupled to the power supply node or be part of a switch-based system that employs multiple diodes to increase the discharge voltage.

20 Claims, 20 Drawing Sheets

DECOUPLING DEVICE USING STORED CHARGE REVERSE RECOVERY

PRIORITY CLAIM

The present application is continuation of U.S. application Ser. No. 17/485,022, entitled "Decoupling Device Using Stored Charge Reverse Recovery," filed Sep. 24, 2021, the disclosure of which is incorporated by reference herein in its entirety.

BACKGROUND

Technical Field

Embodiments described herein relate to integrated circuits and, more particularly, to techniques for managing noise on a power delivery network using decoupling circuits.

Description of the Related Art

Modern computer systems may include multiple circuit blocks designed to perform various functions. For example, such circuit blocks may include processors or processor cores configured to execute software or program instructions. Additionally, the circuit blocks may include memory circuits, mixed-signal or analog circuits, and the like.

In some computer systems, the circuit blocks may be designed to operate using different power supply voltage levels. For example, in some computer systems, power management circuits (also referred to as "power management units") may generate and monitor various power supply signals.

In addition to power management circuits, capacitors are often coupled to power supply nodes (also referred to as "power supply rails"). The capacitors (also referred to as "decoupling capacitors") provide localized energy storage to help maintain the power supply rails at their desired voltage level when the instantaneous current demand from load circuits exceeds the ability of power management circuits to provide transient current to the load circuits.

SUMMARY OF THE EMBODIMENTS

Various embodiments for decoupling a load circuit's current transient from other circuits coupled to a power supply node are disclosed. Broadly speaking, a decoupling circuit includes a diode that is configured to store charge using a charge current. In some embodiments, multiple diodes may be employed to increase the discharge voltage level. In response to a decrease in the voltage level of a power supply node coupled to a load circuit, the decoupling circuit is configured to source a boost current to the power supply node using the charge stored in the diode. A control circuit is configured to inject the charge current into the diode during a charge mode. The control circuit is also configured to couple the decoupling circuit to a load circuit during a boost mode. In some embodiments, the diode may be directly coupled to the power supply node, while in other embodiments, the diode may be coupled to the power supply node via a switch.

BRIEF DESCRIPTION OF THE DRAWINGS

The following detailed description makes reference to the accompanying drawings, which are now briefly described.

DETAILED DESCRIPTION OF EMBODIMENTS

Computer systems may include multiple circuit blocks configured to perform specific functions. For example, a computer system may include a processor circuit, a memory circuit, and various analog, radio-frequency, and mixed-signal circuits. Such analog, radio-frequency, and mixed-signal circuits blocks may perform a variety of functions, such as analog-to-digital conversion, radio-frequency up convert and down convert, amplification of signals, and the like.

The circuit blocks included in a computer system draw power from various power supply nodes (also referred to as "power supply rails") included in the computer system. Voltage regulator or power converter circuits can be used to maintain desired voltage levels on the various power supply nodes within a computer system.

During operation, change in operation of the circuit blocks can result in changes in the amount of current the various circuit blocks draw from their corresponding power supply nodes. In some cases, the changes in current drawn from the power supply nodes may temporarily exceed the amount of current that can be provided by a voltage regulator or power converter circuit. When this occurs, the voltage level of a power supply node may decrease (or "droop") until the voltage regulator or power converter circuit can supply the needed current. Such voltage droops can cause problems with the operation of circuit blocks as well as degrade stored bit values which can result in functional logic failures.

To remediate such transient changes in the voltage level of a power supply node, capacitors are often coupled between the power supply nodes to provide local energy storage for circuit blocks. By providing local energy storage, an increase in current drawn by one circuit block can be at least partially satisfied by the local energy storage, thereby decoupling the circuit block's current transient from other circuit blocks coupled to the same power supply node. Capacitors used in this fashion are referred to as "decoupling capacitors" since they provide the local energy storage needed to decouple current and voltage transients from other circuit blocks coupled to a power supply node.

In many cases, the amount of energy storage needed to reduce voltage droop can necessitate large capacitors. Such capacitors can consume a large amount of area on an integrated circuit and may have poor effective series resistance (ESR) and effective series inductance (ESL), limiting their effectiveness as local energy storage devices. Techniques described in the present disclosure allow for providing local energy storage for a power supply node using diodes. Such diodes have a larger stored charge capacity than a capacitor for a given area, and may be less expensive than capacitors in some circumstances. By employing diodes, computer systems can reduce voltage droop by providing increased local energy storage for less area and cost than a capacitor-based decoupling solution.

Figure 1:
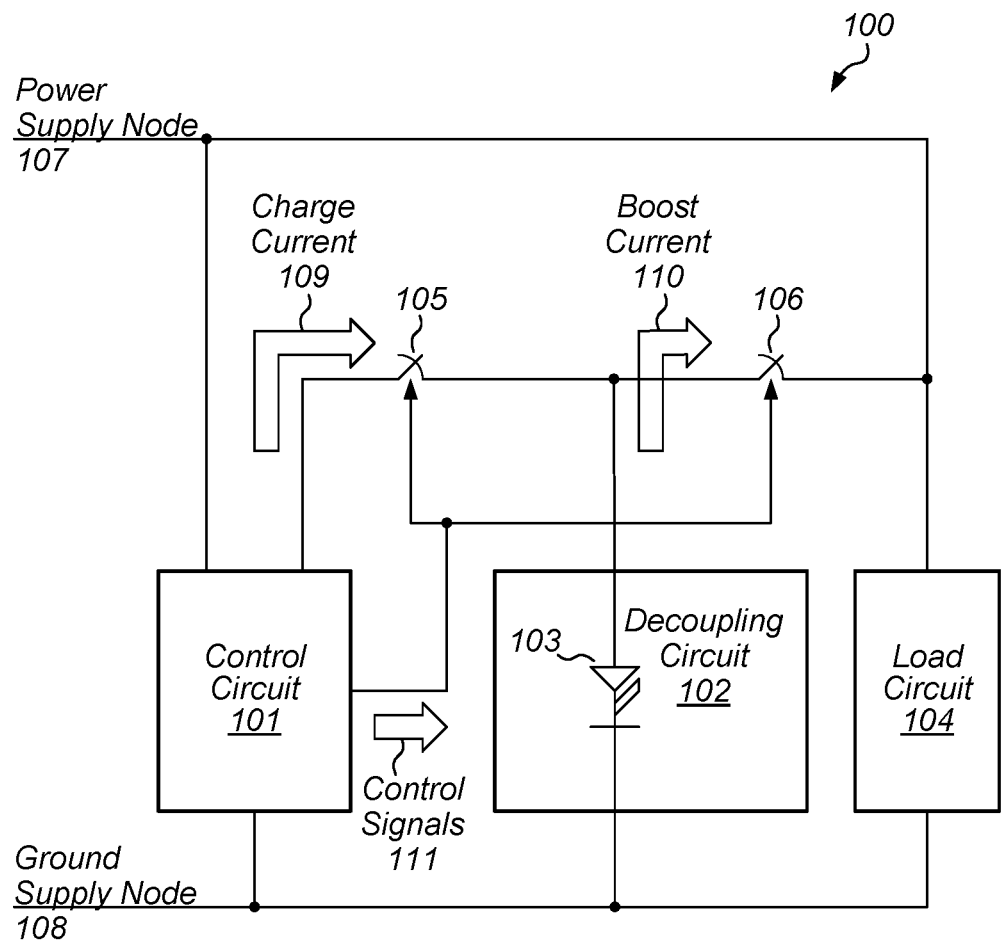
FIG. 1 is a block diagram of an embodiment of a decoupling system.

Turning to FIG. 1, a block diagram of an embodiment of a decoupling system is depicted. As illustrated, decoupling system 100 includes control circuit 101, decoupling circuit 102, and load circuit 104. It is noted that although only a single load circuit is depicted as being coupled to power supply node 107, in other embodiments, multiple load circuits may be coupled to power supply node 107.

Load circuit 104 and control circuit 101 are coupled to power supply node 107. In various embodiments, a power converter or voltage regulator circuit (not shown) may be coupled to power supply node 107 and be configured to generate a particular voltage level on power supply node 107.

Decoupling circuit 102 includes diode 103. In various embodiments, diode 103 is configured to store charge using charge current 109. As described below, when diode 103 is at its desired value, charge current 109 flows into diode 103, which is configured to store charge using charge current 109. Diode 103 may be further configured to store the charge in an intrinsic semiconductor material, and the value of charge current 109 may be sufficiently large to overcome recombination in the intrinsic semiconductor material to maintain the stored charge.

It is noted that although a single diode is depicted as being included in decoupling circuit 102, in other embodiments, multiple diodes may be coupled either in series or in parallel with diode 103. It is further noted that, in some embodiments, decoupling circuit 102 may include one or more capacitors coupled in parallel with diode 103.

Control circuit 101 is configured to source, during a charge mode, charge current 109 and to couple decoupling circuit 102 to load circuit 104 during a boost mode. During boost mode, decoupling circuit 102 is configured to source boost current 110 to power supply node 107 in response to a decrease in a voltage level of power supply node 107. In various embodiments, control circuit 101 may be further configured to decouple decoupling circuit 102 from load circuit 104 during the charge mode. To couple and decouple decoupling circuit 102 to and from load circuit 104, control circuit 101 may be further configured to generate control signals 111 to operate switches 105 and 106.

In various embodiments, control circuit 101 may be configured to generate charge current 109. Control circuit 101 may, in some embodiments, include a reference circuit, and one or more current mirror circuits that may be used to generate charge current 109 using a voltage level of power supply node 107.

Control circuit 101 may, in some embodiments, include a state machine or other suitable sequential logic circuit configured to generate control signals 111. In some cases, control circuit 101 may activate charge mode during periods of low activity of load circuit 104, or in response to an activation of a low-power mode for a computer system that includes decoupling system 100. In some cases, control circuit 101 may cease the generation of charge current 109 during such low-power modes. Control circuit 101 may, in various embodiments, determine a duration of the charge mode based on an amount of charge recombination in diode 103.

In various embodiments, control circuit 101 may activate boost mode during periods of high activity of load circuit 104, in order to provide decoupling capability to power supply node 107 during possible times when increased load currents may occur. In some embodiments, control circuit 101 may switch between charge mode and boost mode at regular intervals. By switching between charge mode and boost mode, control circuit 101 may advantageously couple decoupling circuit 102 to power supply node 107 only during periods when decoupling is needed, thereby reducing power consumption.

Switch 105 is configured to close in response to an activation of one or more of control signals 111. When switch 105 is closed, control circuit 101 is coupled to decoupling circuit 102, allowing charge current 109 to flow into diode 103. Switch 106 is configured to close in response to an activation of a different one or more of control signals 111. When switch 106 is closed, decoupling circuit 102 is coupled to power supply node 107, thereby allowing decoupling circuit 102 to source boost current 110 to power supply node 107. It is noted that both switch 105 and switch 106 may not be closed simultaneously.

Switches 105 and 106 may be implemented as pass gates or other similar structures using any suitable number of metal-oxide semiconductor field-effect transistors (MOSFETs), Fin field-effect transistors (FinFETs), gate-all-around field-effect transistors (GAAFETs), or other suitable switching devices.

In cases where multiple diodes are employed in decoupling circuit 102, the diodes may be charged in parallel during charge mode, and then coupled in series to the load circuit 104 during boost mode. By charging the diodes in parallel and then coupling them to the load in series, higher boost voltages may be achieved. For example, in some embodiments, two diodes may be charged to 600 mV during charge mode. When boost mode is activated, the two diodes are coupled to load circuit 104 in series, providing 1200 mV of boost to the power supply of load circuit 104.

In various embodiments, charging multiple diodes in parallel, at a lower voltage or using a lower bias current, can reduce leakage current during the charge phase. For example, in systems where the voltage level of a power supply is greater than the forward or cut-in voltage of diode 103, using the full power supply voltage to charge diode 103 can cause the leakage current of diode 103 to increase due to high forward bias of diode 103, i.e., diode 103 would essentially be activated. In such situations, multiple diodes can be charged, in parallel, with a voltage that is less than the forward voltage of the diodes, thereby reducing the leakage current during charge mode. Even though each diode is charged to a voltage less than the power supply voltage, during boost mode, the diodes are coupled to the load in series, increasing the boost voltage to the level of the power supply. It is noted that in cases where the voltage level of a power supply is less than the cut-in voltage of diode 103, the use of a single diode may be preferable since the leakage current will be less, and the additional switch circuitry can be omitted to reduce complexity.

In various embodiments, using lower charging voltages to charge multiple diodes in parallel during charge mode may help remediate the effect of temperature on a diode's cut-in voltage. As temperature increases, the diode's cut-in voltage drops, which could further increase the leakage current during charge mode when a full power supply voltage is used to charge a single diode. By employing lower charging voltages across multiple diodes, the charge voltages can be kept less than cut-in voltages of the diodes even during high temperature operation.

In addition to the series discharge method, in some embodiments, changes in the physical properties of diode 103 may be employed to increase the cut-in voltage of diode 103 to allow its use with higher power supply voltage. For example, the doping of the various materials in diode 103 may be altered to increase the cut-in voltage of diode 103. It is noted that such changes may also affect carrier lifetime, ease of integration into a design, as well as cost. In some embodiments, other materials such as SiC, GaAS, or other suitable bandgap materials may be employed to modify the cut-in voltage. Such materials may, in various embodiments, be used to support alternative transistor technologies (e.g., GAA, nano-sheet, ribbon-FET, etc.) that are designed to operate lower voltages. For example, in some cases, such transistors may be configured to operate with voltages below 1-voltage (e.g., 800 mV). In addition to the cut-in voltage of diode 103, other factors (e.g., charge storage, cost, ease of integration, etc.) may influence the design of decoupling system 100.

In some case, the reverse recover charge from diode 103 may be going across a high-voltage junction. This situation can result in the generation of heat that could ultimately lead to damage or destruction of device 103 after repeated charge/discharge cycles, which may set an upper limit on the number of times diode 103 can be cycled. It is noted, however, that in many cases, the charge density in diode 103 is small and the repetition rate is low. In normal switch applications, a diode can have a large voltage across it when discharging its current. In voltage droop applications, however, the voltage across the junction of diode 103 is smaller (corresponding to the voltage droop that diode 103 is trying to correct), so the amount of heat generated is less. In some embodiments, control circuit 101 may be configured to track a number of charge/discharge cycles of diode 103. Control circuit 101 may be further configured, in some cases, to send a warning message when the number of charge/discharge cycles reaches a threshold value. Alternatively, or additionally, control circuit 101 may be further configured to limit the use of diode 103, in response to the determination that the number of charge/discharge cycles has reached the threshold value.

In other embodiments, decoupling system 100 may include multiple charging sources for diode 103 (e.g., different currents sources with different current values). In such cases, control circuit 101 may be further configured to select a particular one of the charging sources based on a predicted load at a given point in time. In various embodiments, the prediction may be made using specified load circuit requirements, temperature, power state of the load circuit, and the like.

In some embodiments, decoupling system 100 may include multiple charge storage devices (e.g., diode 103) with corresponding charge sources. In such cases, control circuit 101 may be further configured to interleave the operation of the charge storage devices. For example, control circuit 101 may be configured to activate a particular charge storage device to discharge into a load circuit, while other charge storage devices are in charge mode. As the charge diminishes in the particular charge storage device, control circuit 101 may be further configured to de-activate the particular charge storage device and place it charge mode, while activating a different charge storage device to discharge into the load circuit. By interleaving the operation of charge storage devices in this fashion, decoupling system 100 can provide adequate charge during extended periods of voltage droop on a power supply node.

Figure 2:
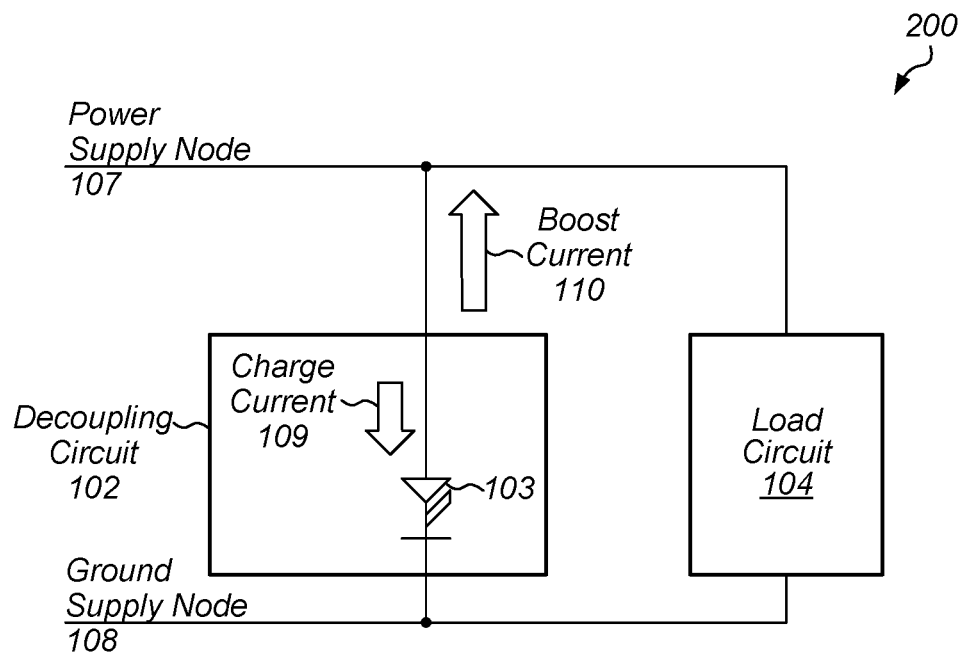
FIG. 2 is a block diagram of another embodiment of a decoupling system.

The decoupling system depicted in FIG. 1 is a switched system that relies on switches to couple a decoupling circuit to a power supply node during certain periods of time. The decoupling circuit may also be operated in a continuous mode where is it always coupled to the power supply node and the operation of the decoupling circuit is based on different bias conditions. A block diagram of such a system is depicted in FIG. 2. While not as flexible in operation as the embodiment of FIG. 1, decoupling system 200 is less complex and consumes less area as it does not need switches and a control circuit.

As illustrated, decoupling system 200 includes decoupling circuit 102 and load circuit 104. Both decoupling circuit 102 and load circuit 104 are coupled between power supply node 107 and ground supply node 108. As described above, load circuit 104 may include any suitable combination of circuits. For example, in various embodiments, load circuit 104 may include a processor circuit, a memory circuit, analog/mixed-signal circuits, and the like.

As described above, decoupling circuit 102 includes diode 103. It is noted that although a single diode is depicted, in other embodiments, multiple diodes may be coupled either in series or in parallel with diode 103. It is further noted that, in some embodiments, decoupling circuit 102 may include one or more capacitors coupled in parallel with diode 103. Although decoupling circuit 102 is depicted as including a diode, in other embodiments, diode 103 may be replaced with a bipolar junction transistor ("BJT"). In such cases, the emitter and collector terminals are coupled between a power supply node and a ground supply node, and charge may be stored in the BJT via the base terminal of the BJT.

It is noted that in other embodiments, the terminals of the BJT may be coupled in a different fashion and may be implemented using a variety of topologies and manufacturing techniques. In various embodiments, a decoupling system may be further configured to dynamically adjust a trickle current used to charge the BJT using the base terminal of the BJT. By adjusting the trickle current, the power efficiency of the BJT used as a charge storage device may be optimized. In some embodiments, the BJT may be fabricated with a drift region of N− material between the base (fabricated with P-type material) and the collector (fabricated with N-type material) to balance charge storage and meet voltage requirements for a particular application and/or workload.

During a first bias condition, the voltage level of power supply node 107 is at its desired value and charge current 109 flows into diode 103, which is configured to store charge using charge current 109. As described below, diode 103 may be further configured to store the charge in an intrinsic semiconductor material, and the value of charge current 109 may be sufficiently large to overcome recombination in the intrinsic semiconductor material to maintain the stored charge.

As described above, during operation, load circuit 104 may increase its demand for current from power supply node 107. Such an increase in demand may be a result of activation of a particular mode of operation, execution of a particular software program or operation, and the like. When the current drawn by load circuit 104 increases in such a fashion, a voltage regulator or power converter circuit coupled to power supply node 107 may be incapable of supplying the additional needed current to power supply node 107, resulting in a voltage drop on power supply node 107, resulting in a second bias condition.

In response to a determination that the voltage level of power supply node 107 drops below its desired value by a threshold value, diode 103 is configured to halt the storage of charge and generate boost current 110, which flows into power supply node 107. In various embodiments, the change in voltage across diode 103 results in carriers (e.g., electrons and holes) moving to the terminals resulting in the generation of boost current 110. In various embodiments, the injection of boost current 110 into power supply node 107 can halt further reduction in the voltage level of power supply node 107 until a voltage regulator or power converter circuit can compensate for the change in the current drawn by load circuit 104.

When diode 103 switches from supplying boost current 110 to storing charge, diode 103 can continue to conduct for a short period of time referred to as the "reverse recovery time." While in reverse recovery time, diode 103 can generate heat, which can lead to damage to diode 103. As such, decoupling circuit 102 may be further configured to track a number of times diode 103 is used to source boost current 110, as well as a frequency with which diode 103 sources boost current 110. In response to a determination that the number of times diode 103 sources boost current 110 and/or the frequency with which diode 103 sources boost current 110 reaches respective threshold values, decoupling circuit 102 may be configured to send a signal to a power management unit or other system management circuit indicating that diode 103 is being overstressed. In such cases, power converter or voltage regulator circuits may be configured to provide additional load current in order to limit the frequency with which drops are occurring on power supply node 107.

The decoupling systems depicted in FIGS. 1 and 2 may, in various embodiments, be used in conjunction with low-dropout voltage regulator circuits to minimize droop on power supply node 107. As described below, a trickle current is used to maintain the charge stored in diode 103. The trickle current is a constant energy loss. In some cases, the loss associated with a trickle current supplying an active decoupling circuit may be greater than power dissipated in a low-dropout regulator circuit. The power dissipated in a low-dropout regulator circuit is a function of the resistance of a series device included in the low-dropout regulator circuit in conjunction with the voltage of the input power supply to the low-dropout regulator circuit and the voltage being supplied to the load circuits.

In various embodiments, either a decoupling circuit (e.g., decoupling circuit 102) or a low-dropout regulator circuit may be activated based on anticipated load currents, power supply voltage levels, the respective power dissipations of the decoupling circuit and the low-dropout regulator circuit, and the like. In other embodiments, a system may employ either a decoupling circuit or a low-dropout ("LDO") regulator circuit for a given power supply node based on the constraints described above, as well as available circuit area. As described above, a BJT may also be used in conjunction with either the diode, or the LDO, or any suitable combination thereof.

Figure 3A:
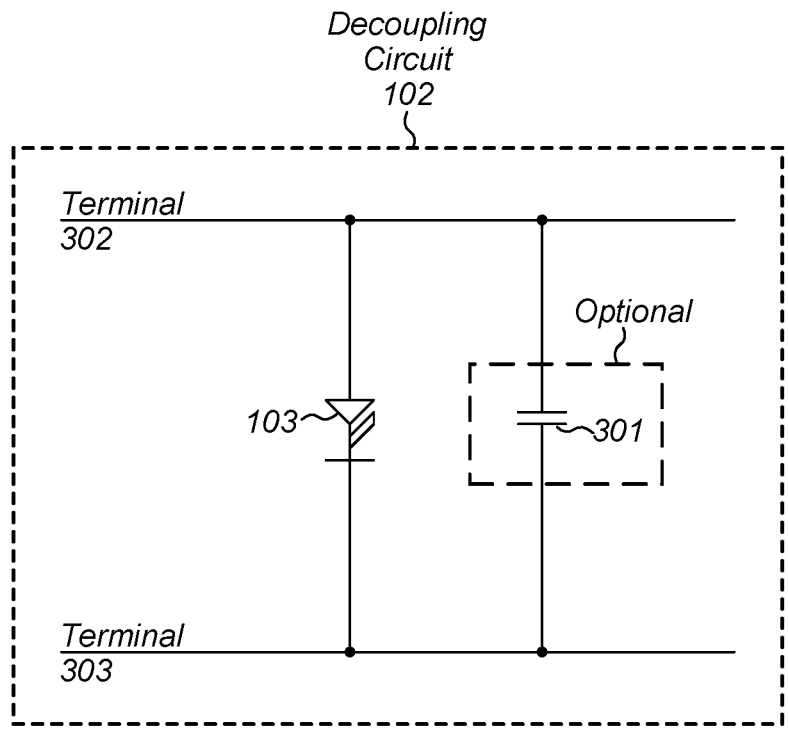
FIG. 3A is a block diagram of an embodiment of a decoupling circuit.

Turning to FIG. 3A, an embodiment of decoupling circuit 102 is depicted. As illustrated, decoupling circuit 102 includes diode 103 and capacitor 301. It is noted that although only one diode and one capacitor are depicted in the embodiment of FIG. 3A, in other embodiments, multiple diodes and multiple capacitors may be employed.

Diode 103 is coupled between terminal 302 and terminal 303. In various embodiments, an anode of diode 103 is coupled to terminal 302, and a cathode of diode 103 is coupled to terminal 303. As described below, diode 103 may be implemented using intrinsic semiconductor material sandwiched between P+ semiconductor material and N+ semiconductor material (commonly referred to as a "PIN diode"). As described below, the respective volumes of the intrinsic, P+, and N+ materials may be adjusted to achieve desired electrical properties for diode 103.

During a charge period, a current may be injected into diode 103 via terminal 302. In various embodiments, diode 103 may be forward biased during the charge period. A small current (referred to as a "trickle current" or "charge current") causes charge to be stored in the intrinsic layer. The charge stored in the intrinsic layer will, over time, be lost due to recombination at the boundaries between the intrinsic layer and the P+ material and the N+ material. This loss of stored charge due to recombination is referred to as leakage. The trickle current also replenishes the lost charge to maintain the charge stored in the intrinsic layer at a desired level and is a constant energy loss. It is noted that to reduce the time to store charge in the intrinsic layer, larger values for the trickle current can be employed.

During a discharge period, the charge stored in the intrinsic layer is released through the P+ material into terminal 302 as a discharge current (discharge current>>charge/trickle current). In various embodiments, the discharge current can supply a portion of the current that a voltage regulator or power converter cannot supply during a transient event, thereby reducing a change in the voltage level of the regulated power supply node.

Although the embodiment of FIG. 3A depicts a single diode coupled between terminals 302 and 303, in other embodiments, multiple diodes may be coupled in series between terminals 302 and 303, forming a diode "stack." By connecting multiple diodes in series between terminals 302 and 303, the discharge voltage of decoupling circuit 102 may be increased, improving the range of applications in which decoupling circuit 102 may be employed.

In some cases, additional diodes may be coupled either in series or in parallel with diode 103. The additional diodes may be switched in and out of decoupling circuit 102 based on power supply voltage level, temperature, and the like, in order to best tune the performance of decoupling circuit 102 for a given set of operating conditions.

Capacitor 301 is coupled between terminal 302 and terminal 303. In various embodiments, capacitor 301 is configured to provide local energy storage to bolster the voltage level of terminal 302 during transient events. It is noted that capacitor 301 is optional, and can be used in conjunction with the charge storage capabilities of diode 103. In various embodiments, capacitor 301 may be implemented using a metal-oxide-metal (MOM) structure, a metal-insulator-metal (MIM) structure, or any other suitable structure available on a semiconductor manufacturing process.

Figure 3B:
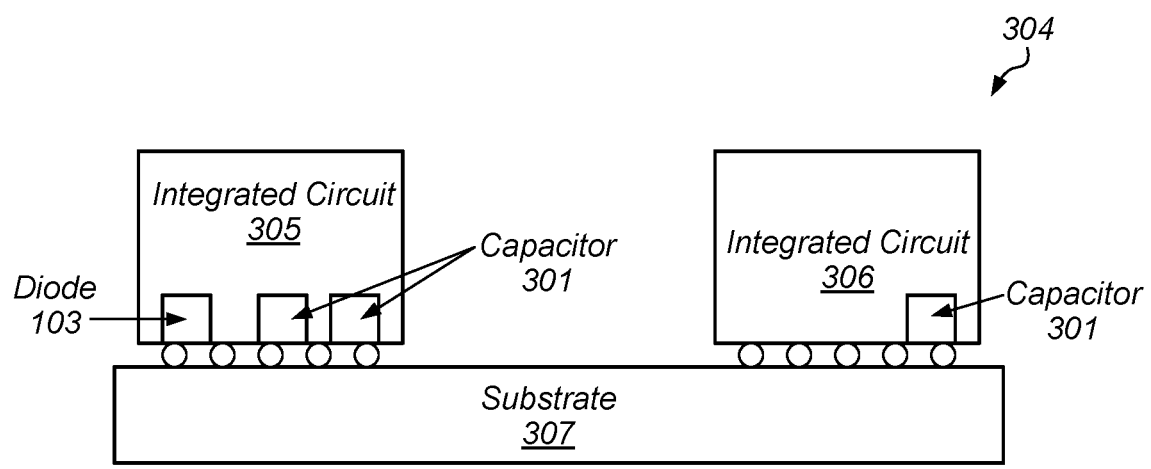
FIG. 3B is a block diagram of another embodiment of a decoupling circuit.

A block diagram of another embodiment of a system that includes a decoupling circuit is depicted in FIG. 3B. As illustrated, system 304 includes integrated circuits 305 and 306, which are mounted on a common substrate 307. In the embodiment of FIG. 3B, capacitor 301 may be located in a variety of different locations relative to diode 103. For example, capacitor 301 and diode 103 may be both located on integrated circuit 305. Alternatively, diode 103 can be located on integrated circuit 305, while capacitor 301 is located on integrated circuit 306.

Figure 4:
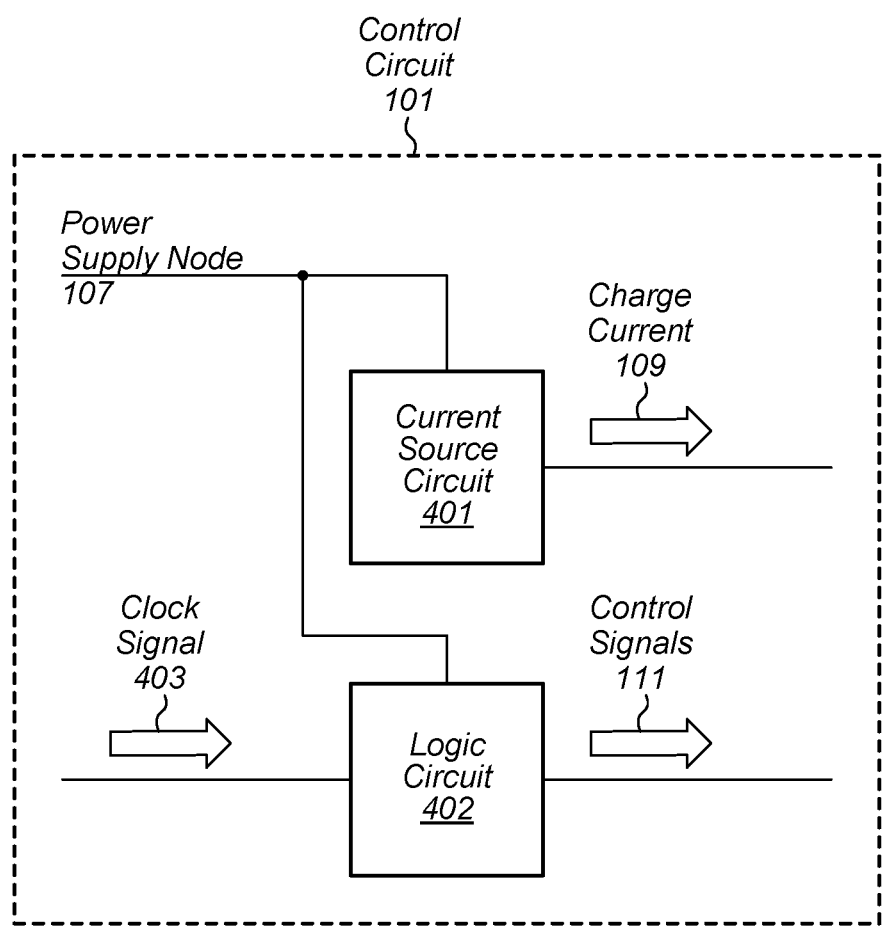
FIG. 4 is a block diagram of an embodiment of a control circuit for a decoupling system.

Turning to FIG. 4, a block diagram of an embodiment of control circuit 101 is depicted. As illustrated, control circuit 101 includes current source circuit 401 and logic circuit 402.

Current source circuit 401 is configured to generate charge current 109 using power supply node 107. In various embodiments, current source circuit 401 may be further configured to generate charge current 109 such that a value of charge current 109 remains constant relative to the voltage on power supply node 107. In some embodiments, the value of charge current 109 may be based on an amount of charge recombination that occurs within diode 103. In other embodiments, current source circuit 401 may be further configured to adjust a value of charge current 109 based on operating conditions of computer system 100. For example, in low power states, charge current 109 can be decreased since less charge storage is needed, while, in high power states, charge current 109 may increase to provide a larger amount of stored charge. Current source circuit 401 may, in some embodiments, include multiple p-channel and n-channel metal-oxide semiconductor field-effect transistors (MOSFETs), FinFETs, gate-all-around FETs (GAAFETs), or any other suitable transconductance devices.

Logic circuit 402 is configured to generate control signals 111 using clock signal 403. In various embodiments, logic circuit 402 may activate and deactivate particular ones of control signals 111 based on a number of pulses that occur on clock signal 403. In some cases, logic circuit 402 may activate or deactivate given ones of control signals 111 based on a voltage level of power supply node 107. For example, in response to a determination that the voltage level of power supply node 107 has dropped below a threshold value, logic circuit 402 may be configured to activate one or more of control signals 111 for a duration based on a number of pulses of clock signal 403.

In various embodiments, logic circuit 402 may be implemented using any suitable combination of sequential logic circuits and combinatorial logic circuits. For example, in some cases, logic circuit 402 may include one or more counter circuits configured to increment based on pulses of clock signal 403. In some cases, logic circuit 402 may include one or more mixed-signal or analog circuits configured to compare a voltage level of power supply node 107 to a threshold value.

Figure 5:
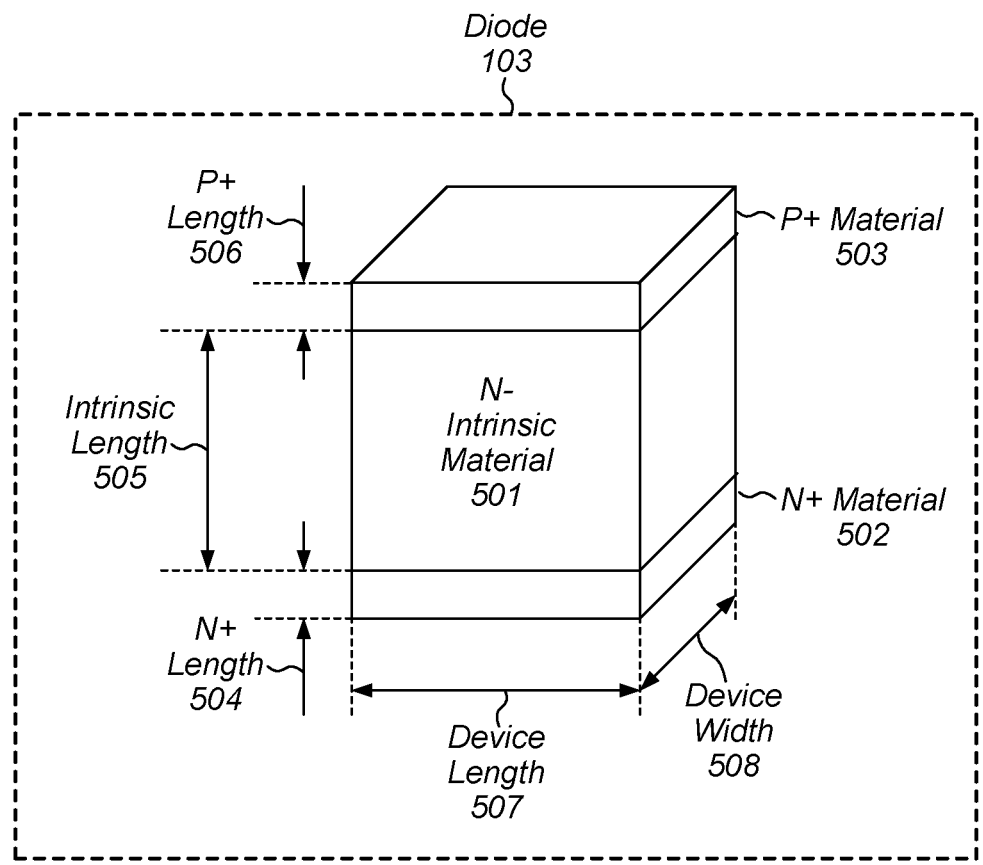
FIG. 5 is a block diagram of an embodiment of a diode used in a decoupling circuit.

Turning to FIG. 5, a block diagram of an embodiment of diode 103 is depicted. As illustrated, diode 103 includes N− intrinsic material 501, N+ material 502, and P+ material 503.

N− intrinsic material 501 may, in various embodiments, correspond to a pure or un-doped or lightly doped semiconductor material such as silicon, germanium, etc. With the absence of dopant species, the number of charge carriers are determined by the physical properties of N− intrinsic material 501. In various embodiments, a number of excited electrons and holes may be equal. As depicted, the length of N− intrinsic material 501 is intrinsic length 505, while the width and depth of N− intrinsic material 501 are device width 508 and device length 507, respectively. It is noted that an amount of charge that can be stored in N− intrinsic material 501 may be based on a volume of N− intrinsic material 501.

In some embodiments, N+ material 502 may correspond to a semiconductor material doped with a donor element from Group V of the periodic table such as phosphorous, arsenic, etc. When a donor dopant is introduced into the semiconductor material, one of the valence electrons of the donor dopant atom is weakly bonded, allowing it to move within the semiconductor material acting as a charge carrier. As depicted, the length of N+ material 502 is N+ length 504, while the width and depth of N+ intrinsic material 501 are device width 508 and device length 507, respectively.

Like N+ material 502, P+ material 503 may correspond to semiconductor material that includes an acceptor dopant species. In the case of P+ material 503, the dopant species may be from Group III of the periodic table (e.g., boron). When an acceptor dopant is introduced into the semiconductor material, the acceptor becomes negatively charged, leaving an unsatisfied bond. Electrons can migrate from neighboring bonds to fulfill the unsatisfied bond in a chain-like process that results in a "hole" moving within the semiconductor material that can act a charge carrier. As depicted, the length of P+ material 503 is P+ length 506, while the width and depth of P+ material 503 are device width 508 and device length 507, respectively.

Figure 6A:
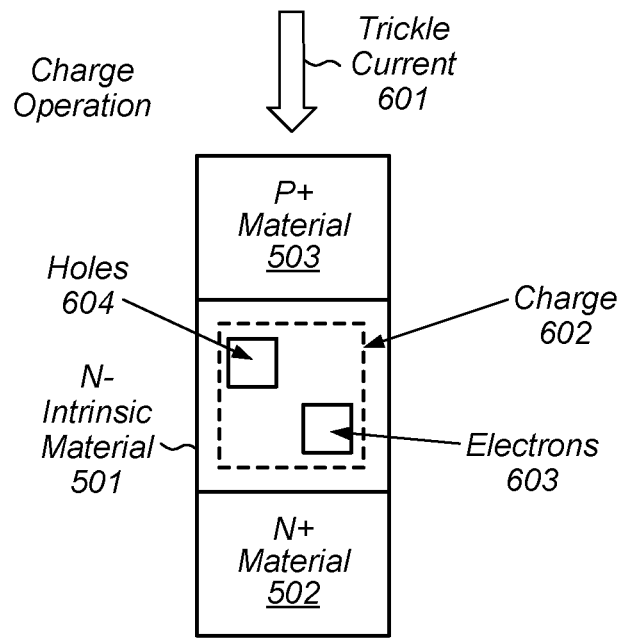
FIG. 6A is a block diagram illustrating the operation of a diode during a charge operation.

As described above, diode 103 can be both charged and discharged. A depiction of a charge operation for diode 103 is depicted in FIG. 6A. Trickle current 601 is injected into diode 103 via P+ material 503 to charge diode 103.

As described above, during a charge period, a current is injected into P+ material 503 by applying an electric field across diode 103. The injection of the current results in the injection of electrons 603 and holes 604 into N− intrinsic material 501. As the electrons and holes accumulate in N− intrinsic material 501, charge 602 is stored in N− intrinsic material 501. In various embodiments, electrons 603 and holes 604 migrate through N− intrinsic material 501 in a process called ambipolar diffusion.

As electrons 603 and holes 604 accumulate, some of electrons 603 and holes 604 recombine reducing an amount of charge 602. A lifetime of a carrier within N− intrinsic material 501 is referred to its "charge lifetime" or "recombination time constant." Trickle current 601 needs to be sufficiently large to account for the recombination of electrons and holes in order to maintain an amount of charge 602. It is noted that the leakage resulting from the recombination of electrons and holes is temperature dependent. As the temperature increases, the amount of leakage increases, which forces trickle current 601 to be larger in order to maintain the same amount of charge. In some embodiments, control circuit 101 may include a temperature sensor circuit and be further configured to adjust the value of trickle current 601 to compensate for changes in temperature.

In various embodiments, the charge lifetime is a function of dopant concentration in the intrinsic region. As such, there is a trade-off in the design of diode 103 between stored charge and the charge lifetime. Higher dopant concentrations in the intrinsic region of diode 103 can increase the amount of charge diode 103 can store, but decrease the charge lifetime, resulting in a higher leakage current.

The dopant concentration in the intrinsic region can also affect the discharge resistance of diode 103. When diode 103 discharges, a voltage drop is developed across diode 103 due to its discharge resistance. In various embodiments, diode 103 is designed to minimize the discharge resistance, which can be accomplished by using a higher dopant concentration in the intrinsic region or by increasing the volume of the intrinsic region.

Figure 6B:
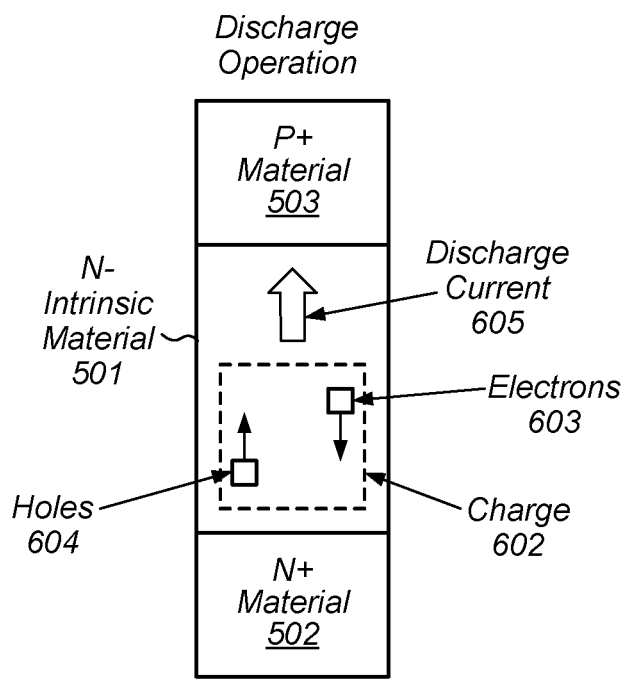
FIG. 6B is a block diagram illustrating the operation of a diode during a discharge operation.

Turning to FIG. 6B, a block diagram of diode 103 during a discharge operation is depicted. As described above, during a discharge operation, trickle current 601 is discontinued. When this occurs, discharge current 605 flows from N− intrinsic material 501 into P+ material 503 and out onto a circuit node coupled to P+ material 503. Discharge current 605 is the result of electrons 603 moving towards N+ material 502, and holes 604 moving towards P+ material 503. Discharge current 605 will continue until there are no holes or electrons available to migrate to their respective destinations, or trickle current 601 is re-applied, or when a voltage level of the anode of charge diode 103 is substantially the same as the voltage level of power supply node 107.

Figure 7:
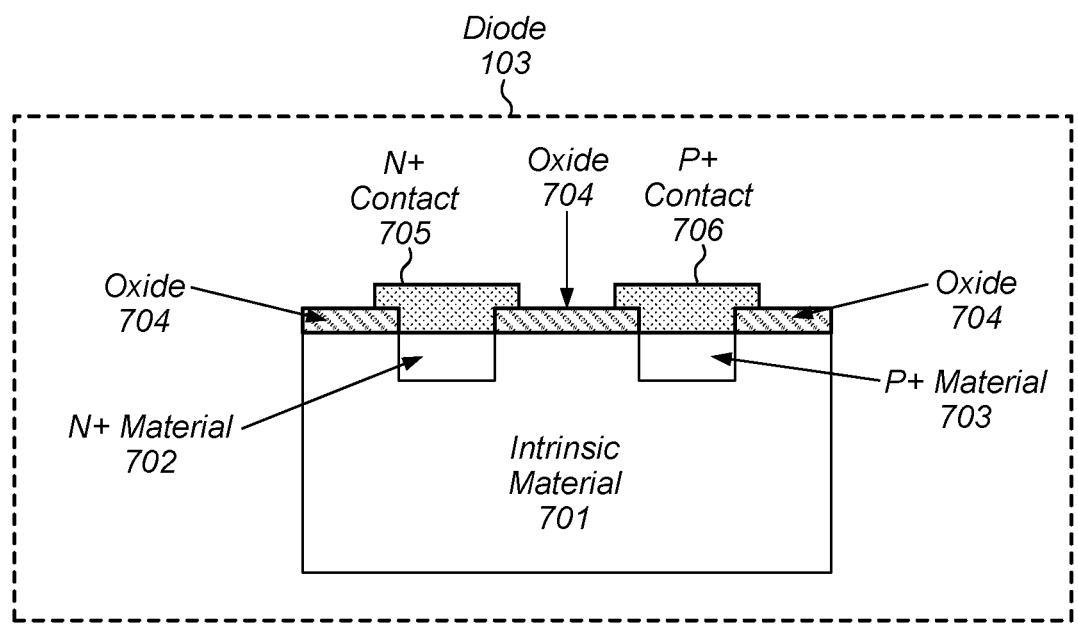
FIG. 7 is a block diagram depicting an embodiment of a lateral diode for a decoupling system.

PIN diodes may be implemented with a variety of topologies. A block diagram of one such embodiment is depicted in FIG. 7. As illustrated, diode 103 is a lateral PIN diode that includes intrinsic material 701, N+ material 702, P+ material 703, oxide 704, N+ contact 705 and P+ contact 706. As used and defined herein, a lateral diode is a diode whose terminals are co-located on a same side of the diode.

Intrinsic material 701 may, in various embodiments, correspond to a pure or un-doped or lightly doped semiconductor material such as silicon, germanium, etc. With the absence of dopant species, the number of charge carriers are determined by the physical properties of intrinsic material 701 near N+ material 702 and P+ material 703.

N+ material 702 may correspond to a semiconductor material doped with a donor element from Group V of the periodic table such as phosphorous, arsenic, etc. When a donor dopant is introduced into the semiconductor material, one of the valence electrons of the donor dopant atom is weakly bonded, allowing it to move within the semiconductor material acting as a charge carrier. Electrical properties of N+ material 702 depend on the length and width of N+ material 702, as well as the depth to which the atoms of the donor element are driven into intrinsic material 702.

P+ material 703 may correspond to semiconductor material that includes an acceptor dopant species. In the case of P+ material 503, the dopant species may be from Group III of the periodic table (e.g., boron). When an acceptor dopant is introduced into the semiconductor material, the acceptor becomes negatively charged, leaving an unsatisfied bond. Electrons can migrate from neighboring bonds to fulfill the unsatisfied bond in a chain-like process that results in a "hole" moving within the semiconductor material that can act a charge carrier. Electrical properties of P+ material 703 depend on the length and width of P+ material 703, as well as the depth to which the atoms of the acceptor dopant species are driven into intrinsic material 702.

Oxide 704 may be either grown or deposited across the top of intrinsic material 701. Openings in oxide 704 may be left (or etched open) to provide connections to N+ material 702 and P+ material 703. Into such openings, a metal material (e.g., tungsten) is deposited to form an electrical connection to N+ material 702 and P+ material 703. As illustrated, N+ contact 705 forms a connection with N+ material 702, while P+ contact 706 form a connection with P+ material 703. In various embodiment, traces on additional metal layers may be used to connect N+ contact 705 and P+ contact 706 to include diode 103 in a decoupling system, or any other suitable circuit.

Figure 8:
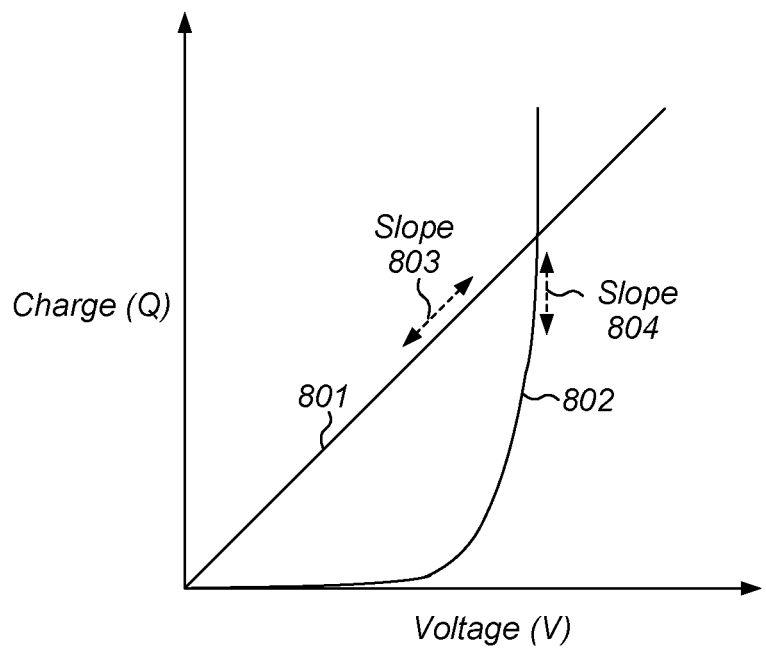
FIG. 8 depicts a graph showing charge versus voltage for a capacitor and a diode.

Turning to FIG. 8, a graph illustrating the respective relationships between charge and voltage for a capacitor and a PIN diode is depicted. As illustrated, waveform 801 depicts the charge stored in a capacitor as a function of voltage across the capacitor, while waveform 802 depicts the charge stored in a PIN diode as a function of the voltage across the PIN diode.

The charge stored in a capacitor is given by Equation 1, where C is the value of the capacitor, and V is the voltage across the capacitor. The charge stored in the capacitor is proportional to the voltage across the capacitor, where the constant of proportionality is the value of the capacitor.

$$Q_{cap} = C \cdot V \quad (1)$$

During a voltage drop on a power supply node, the amount of charge that the capacitor can provide to the power supply node is given by Equation 2, where ΔV is the change in the voltage drop across the capacitor. For a 1 microfarad capacitor, with a 26-millivolt change in the voltage level of the power supply, the capacitor can supply 26-nanocoulombs of charge. As depicted in waveform 801, slope 803, which corresponds to the value of the capacitor, is constant across any particular range of voltage and charge values.

$$\Delta Q_{cap} = C \cdot \Delta V \quad (2)$$

The charge stored in a PIN diode, e.g., diode 103, is given by Equation 3, where $I_f$ is the forward bias current of the diode, and r is the recombination time constant, i.e., the charge lifetime. It is noted that $I_f$ should be kept as small as possible so as to avoid wasting DC power.

$$Q_{diode} = I_f \tau \quad (3)$$

Substituting for the forward bias current, charge stored in the diode can be expressed as shown in Equation 4, where $V_f$ is the forward bias voltage and $V_t$ is the thermal voltage. As shown in Equation 4, there is an exponential relationship between the charge stored in a PIN diode and voltage across the PIN diode.

$$Q_{diode} = I_0 \left( e^{\frac{V_f}{V_t}} \right) \tau \quad (4)$$

The exponential nature of the charge stored in a PIN diode can be seen in slope 804 of waveform 802. Unlike waveform

801, the slope of waveform 802 varies and, over some range of voltages, the slope of waveform 802 becomes nearly vertical, which can be advantageous during a voltage drop on a power supply node because the effective capacitance of a PIN diode may be significantly larger than a capacitor.

During a voltage drop on a power supply node, the amount of charge that the PIN diode can provide to the power supply node is given by Equation 5, where $\Delta V_f$ is the change in the voltage drop across the PIN diode. For a diode with a forward bias current of 10-milliamperes and a recombination time of 1-millisecond, Q is 10-microfarads according to Equation 3. Using this value along with a change in voltage of 26-millivolts on a power supply node, the PIN diode has 28-microcoulombs of charge available to source to the power supply node. Compared to the capacitor example above, the PIN diodes provides effective capacitance approximately 1000 times larger than the capacitor.

$$\Delta Q_{diode} = Q \left( e^{\frac{\Delta V_f}{V_t}} \right) \tau \qquad (5)$$

As described earlier, materials with different bandgaps or different types of dopant atoms may be employed to adjust the cut-in voltage of a diode, bipolar transistor, or other suitable device for use in a decoupling system. To illustrate the need for modification of the cut-in voltage, sample waveforms depicting the droop on a power supply node are depicted in FIGS. 9A and 9B.

Figure 9A:
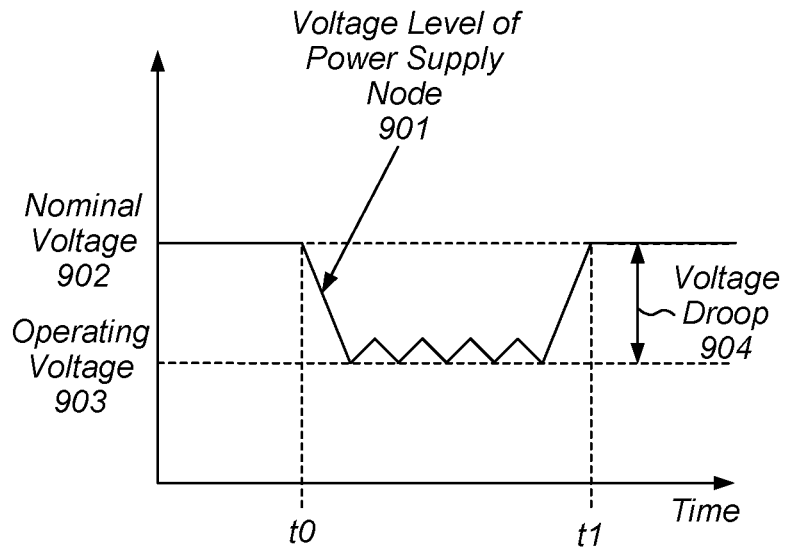
FIG. 9A depicts power supply droop for a particular power supply voltage.
Figure 9B:
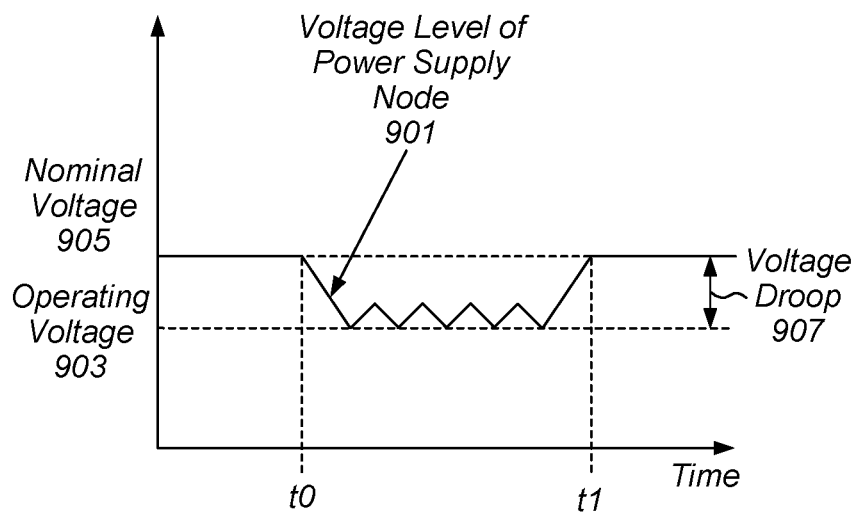
FIG. 9B depicts power supply droop for a different power supply voltage.

Turning to FIG. 9A, an example waveform showing the behavior of power supply node 901 is depicted. In various embodiments, power supply node 901 may correspond to power supply node 107 or any other suitable power supply node in a computer system. Prior to time t0, the value of power supply voltage level 901 is nominal voltage 902 (e.g., 1000 mV), which may be generated by a voltage regulator or power converter circuit.

At time t0, current drawn from power supply node 901 increases, and the voltage level of power supply node 901 drops from nominal voltage 902 to operating voltage 903 by voltage droop 904. The voltage drop can continue until the power voltage level or the power converter can bring the voltage level of power supply node 901 back to nominal voltage 902.

The value of voltage droop 904 can be based on a variety of factors such as the magnitude of the additional current demand, values of passive decoupling circuits, and the like. For example, voltage droop 904 may be 100 mV, resulting in a value for operating voltage 903 of 900 mV from a nominal voltage 902 value of 1000 mV.

Knowing that voltage droop on a power supply node can occur, the nominal voltage of the power supply node (e.g., nominal voltage 902) must be set sufficiently high in order to maintain, during a voltage droop, a voltage on the power supply node that is still sufficient to operate load circuits (e.g., operating voltage 903). Allowing the voltage level of power supply node 901 to decrease below operating voltage 903 can result in load circuits failing to function properly.

It is noted that during the interval between time t0 and t1, the voltage level of power supply node 901 has slight variations or "noise." Such noise can be the result of transients induced into the voltage level of power supply node 901 by parasitic inductance and capacitance in a power distribution network that includes power supply node 901. Additionally, the noise may be the result of switching noise of load circuits coupled to power supply node 901.

As described above, decoupling circuits configured to perform reverse charge recovery may be used to help reduce voltage droop on power supply nodes. Turning to FIG. 9B, waveforms depicting the use of such decoupling circuits are depicted. As illustrated, voltage droop 907 is less than voltage droop 904. For example, in some embodiments, voltage droop 907 may be 25 mV compared to the 100 mV of voltage droop 904. The reduction in the voltage droop can be the result of employing active decoupling circuits configured to perform reverse charge recovery.

Since the circuits can operate as specified at the operating voltage 903, and the voltage droop on power supply node 901 can be limited, the nominal value of the voltage level of power supply node 901 may be reduced. For example, assuming a value of 25 mV for voltage droop 904, nominal voltage 905 maybe be set to 925 mV, which is a reduction of 75 mV from the example value of nominal voltage 1000 mV described above. In addition to saving power by using a lower nominal voltage, the lower nominal voltage level also reduces the forward-bias leakage through a diode (e.g., diode 103) used in the decoupling circuit. It is noted that with the reduced nominal voltage level, the cut-in voltage of the diode may be modified using one of the above-described techniques.

Figure 10A:
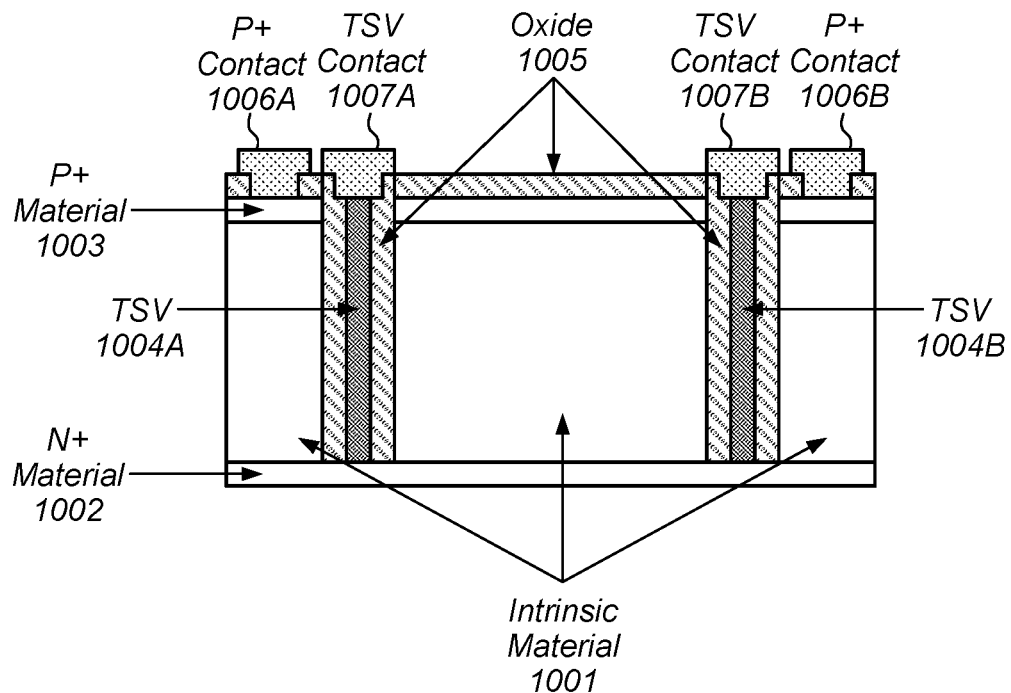
FIG. 10A is a block diagram illustrating a cross-section of a diode used in a decoupling circuit.
Figure 10B:
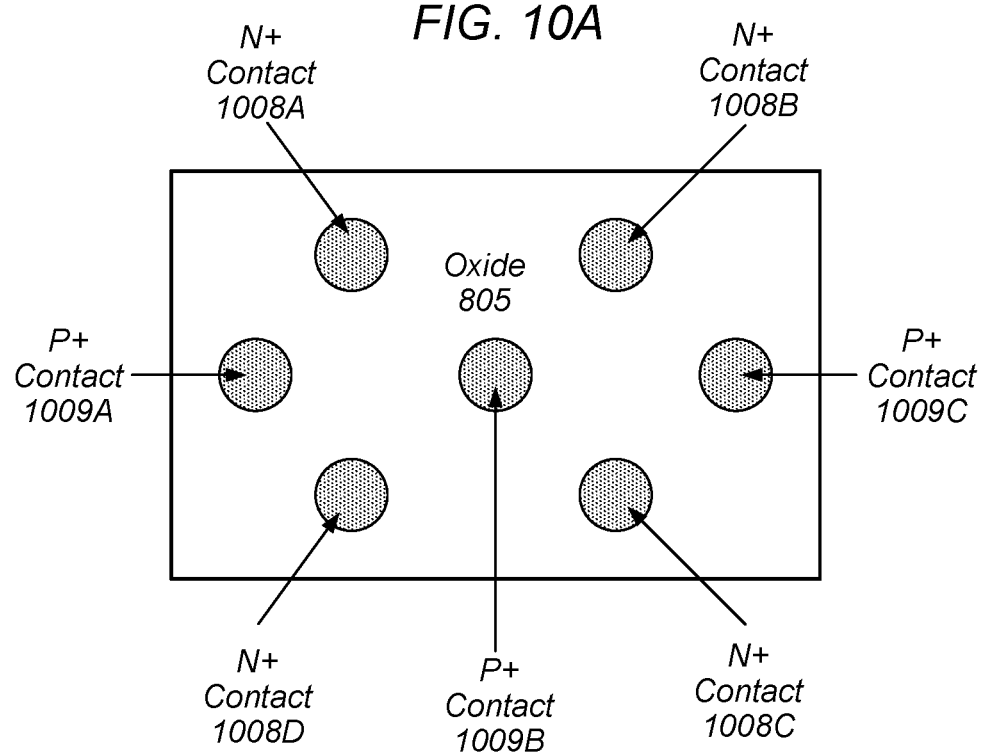
FIG. 10B is a block diagram illustrating a top view of a diode used in a decoupling circuit.

Diodes, such as diode 103, may be fabricated using a variety of structures. An example structure that may be used to fabricate diode 103 is depicted in FIGS. 10A and 10B. It is noted that such diodes may be fabricated on an integrated circuit with other functional circuit blocks (e.g., processor circuits, memory circuits, etc.), or on an interposer as described below.

FIG. 10A depicts a cross-section of a particular structure of diode 103. As illustrated, diode 103 includes intrinsic material 1001, N+ material 1002, P+ material 1003, oxide 1005, two through-silicon vias (denoted "TSV 1004A" and "TSV 1004B"), two TSV contacts (denoted "TSV contact 1007A" and "TSV contact 1007B"), and two P+ material contacts (denoted "P+ contact 1006A" and "P+ contact 1006B").

Intrinsic material 1001 is sandwiched between N+ material 1002 and P+ material 1003 in order to form a PIN diode structure for diode 103. To allow connection to the cathode (N+ material 1002) of diode 103, holes are etched into P+ material 1003 and intrinsic material 1001. The walls of the etched regions are covered with oxide 1005, leaving a smaller hole into which a conductor may be deposited, forming a through-silicon via. In various embodiments, the conductor used to implement TSVs 1004A-B may be a conductive copper-based paste, or any other suitable conductive material. It is noted that oxide 1005 may, in some embodiments, correspond to silicon dioxide, and that additional materials (e.g., barrier metals) may be used in conjunction with oxide 1005 to line the etched holes in intrinsic material 1001.

It is noted that the thickness of intrinsic material 1001, N+ material 1002, and P+ material 1003 may be varied to achieve desired electrical characteristics of diode 103. Moreover, the diameters of TSVs 1004A-B may also be varied to tune a resistance in series with the cathode of diode 103.

During manufacture, holes are etched in oxide 1005 to provide an opening to connect to the TSV 1007A-B and P+ material 1003. Into the holes, a metal material (e.g., tungsten) can be deposited to form a contact that makes an electrical connection to the material underneath. As illustrated, P+ contacts 1006A-B connect to P+ materials 1003, while TSV contacts 1007A-B connect to TSV 1004A-B, respectively. In various embodiments, metal traces on additional layers can be used to couple P+ contacts 1006A-B and TSV contacts 1007A-B to other nodes within an integrated circuit.

FIG. 10B depicts a top view of the particular structure of diode 103. As illustrated, diode 103 includes four N+ material contacts (denoted "N+ contact 1008A," "N+ contact 1008B," "N+ contact 1008C," and "N+ contact 1008D") and three P+ material contacts (denoted "P+ contact 1009A," "P+ contact 1009B," and "P+ contact 1009C"). In various embodiments, N+ contacts 1008A-D provide connections to N+ material 1002 via corresponding through-silicon vias. P+ contacts 1009A-C provide connections to P+ material 1003.

Although four N+ contacts and three P+ contacts are depicted in the embodiment of FIG. 10B, in other embodiments, any suitable number of N+ contacts (and accompanying through-silicon vias) and P+ contacts may be employed. For example, in some cases, additional N+ contacts and associated through-silicon vias may be used to decrease the resistance in series with the cathode of diode 103. In a similar fashion, additional P+ contacts may be employed to reduce the resistance in series with the anode of diode 103.

It is noted that the orientation depicted in FIG. 10B is merely an example. In other embodiments, the "top" of diode 103 may be N+ material 1002 instead of P+ material 1003. In such cases, oxide 1005 may be insolating N+ material 1002, and TSVs 1004A-B may be used to provide connection points to P+ material 1003.

In some cases, a semiconductor manufacturing process used to fabricate a particular integrated circuit may not allow for the manufacture of certain active or passive devices. Such devices may be fabricated on a separate integrated circuit using a different semiconductor manufacturing process. The different integrated circuits may be mounted on a common substrate during assembly of a computer system.

Figure 11:
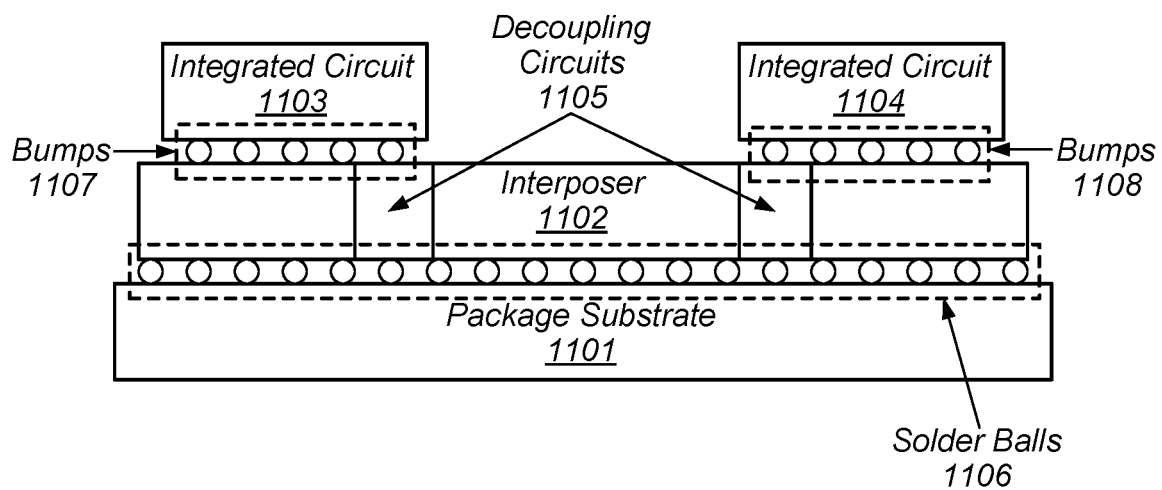
FIG. 11 is a block diagram depicting a package system that employs an interposer that includes decoupling circuits.

In some cases, the pitch of connection points on an integrated circuit may be too fine for connection to a package substrate. In other cases, connection points on an integrated circuit need to be re-routed in order to match up to corresponding locations on the package substrate. To alleviate such problems, an interposer may be employed between the integrated circuits and the package substrate. In addition to compensating for the pitch of connection points on an integrated circuit and re-routing connections to desired locations, interposers may additionally include devices or circuits, such as all or part of a decoupling circuit. An embodiment of a package system that employs an interposer which includes devices is depicted in FIG. 11. As illustrated, package system 1100 includes package substrate 1101, interposer 1102, and integrated circuits 1103 and 1104.

Integrated circuit 1103 is coupled to interposer 1102 using bumps 1107, while integrated circuit 1104 is coupled to interposer 1102 using bumps 1108. It is noted that, in some embodiments, bumps 1107 and 1108 may be implemented a micro-bumps or hybrid bumps. It is noted that the size and pitch of bumps 1107 and 1108 are depicted in FIG. 11 for clarity. In some embodiments, bumps 1107 and 1108 may be on the order of 20 microns in diameter for micro-bumps or below 10 microns for hybrid bumps. In various embodiments, integrated circuits 1103 and 1104 may be systems-on-a-chip (SoCs), power management integrated circuits (PMICs), or may include any other suitable types of circuits. It is noted that although only two integrated circuits are depicted in the embodiment of FIG. 11, in other embodiments, any suitable number of integrated circuits may be coupled to interposer 1102.

In some cases, integrated circuit 1103 may be manufactured using a different semiconductor manufacturing process than integrated circuit 1104. For example, integrated circuit 1103 may be an SoC fabricated with a semiconductor manufacturing process that provides high-speed switching devices (e.g., transistors), while integrated circuit 1104 may be a PMIC fabricated with a different semiconductor manufacturing process that provides high-voltage devices used in power converter and voltage regulator circuits.

Interposer 1102 is coupled to package substrate 1101 using solder balls 1106. In various embodiments, interposer 1102 may include multiple layers with conductive traces that route connection points on one side of interposer 1102 to connection points on an opposite side of interposer 1102. Interposer 1102 may, in some cases, include power and/or ground planes to reduce the impedances for power and ground between package substrate 1101 and integrated circuits 1103 and 1104. It is noted that in some embodiments, solder balls 1106 may be implemented as metal-metal hybrid bonds.

Interposer 1102 includes decoupling circuits 1105. In various embodiments, decoupling circuits 1105 may correspond to decoupling circuit 102 and may include a diode, a capacitor, a BJT, an LDO regulator circuit, or combination thereof. In cases where decoupling circuits 1105 includes diodes, the diodes may have a similar structure to the embodiments depicted in FIGS. 10A and 10B.

Package substrate 1101 is configured to provide package system 1100 with mechanical base support. Additionally, package substrate 1101 is also configured to form an electrical interface that allows integrated circuits 1103 and 1104 access to other components within a computer system.

Figure 12A:
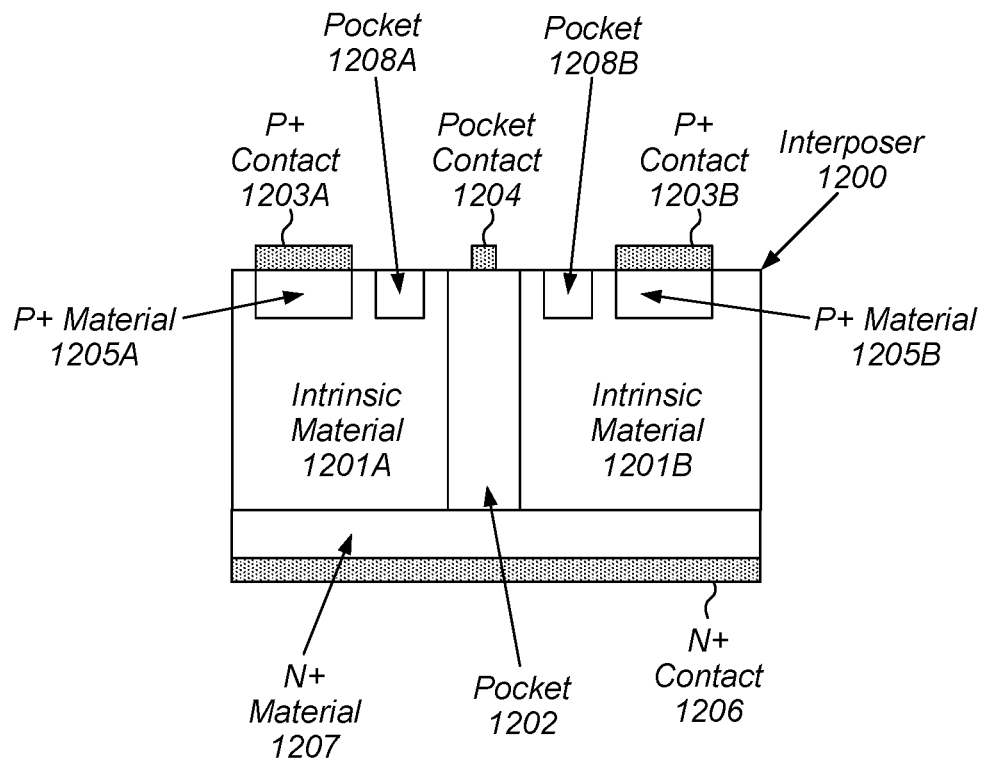
FIG. 12A is a block diagram of a section of an interposer for use in a package system.

In some cases, an interposer (e.g., interposer 1102) can include multiple power supply regions or islands. Turning to FIG. 12A, a cross-section of an interposer that includes multiple power supply regions is depicted. As illustrated, interposer 1200 includes intrinsic material 1201A-B, pocket 1202, P+ contacts 1203A-B, pocket contact 1204, P+ material 1205A-B, N+ contact 1206, N+ material 1207 and pockets 1208A-B.

Each of Intrinsic material areas 1201A and 1201B may, in various embodiments, correspond to a pure or un-doped or lightly doped semiconductor material such as silicon, germanium, etc. With the absence of dopant species, the number of charge carriers are determined by the physical properties of intrinsic material 1201A-B near N+ material 1207 and P+ materials 1205A-B.

As noted above, intrinsic material 1201A may be a different voltage level than intrinsic material 1201B. To prevent latch-up from occurring, intrinsic material 1201A needs to be isolated from intrinsic material 1201B. In the illustrated embodiment, the isolation is performed using pocket 1202 and pockets 1208A-B. In various embodiments, pocket 1202 may correspond to P+ material similar to P+ materials 1205A-B, and can be implemented by driving dopant atoms into pocket 1202. It is noted that, in various embodiments, the doping profile of pocket 1202 may be determined to avoid leakage from pocket 1202 into N+ material 1207. In various embodiments, pockets 1208A-B may be implemented by driving dopant atoms into intrinsic materials 1201A-B, respectively. In various embodiments, pockets 1208A-B may include dopant items similar to N+ material 1207.

P+ materials 1205A-B may correspond to semiconductor material that includes an acceptor dopant species driven into intrinsic materials 1201A-B, respectively. In the case of P+ materials 1205A-B, the dopant species may be from Group III of the periodic table (e.g., boron). Electrical properties of P+ materials 1205A-B depend on the respective lengths and widths of P+ materials 1205A-B, as well as the depth to which the atom of the acceptor dopant species are driven into intrinsic materials 1201A-B, respectively.

N+ material 1207 may correspond to a semiconductor material doped with a donor element from Group V of the periodic table such as phosphorous, arsenic, etc. Electrical properties of N+ material 1207 depend on the length and width of interposer 1200, as well as the depth to which the atoms of the donor element are driven into intrinsic material 1201A-B. It is noted that, in various embodiments, N+ material 1207 may be coupled to a ground supply node via N+ contact 1206.

P+ contacts 1203A-B provide connections to P+ materials 1205A-B, respectively. In a similar fashion, N+ contact 1206 provides a connection to N+ material 1207, and pocket contact 1204 provides a connection to pocket 1202. In various embodiments, P+ contacts 1203A-B, pocket contact 1204, and N+ contact 1206 may be implemented using tungsten or other suitable metal.

Figure 12B:
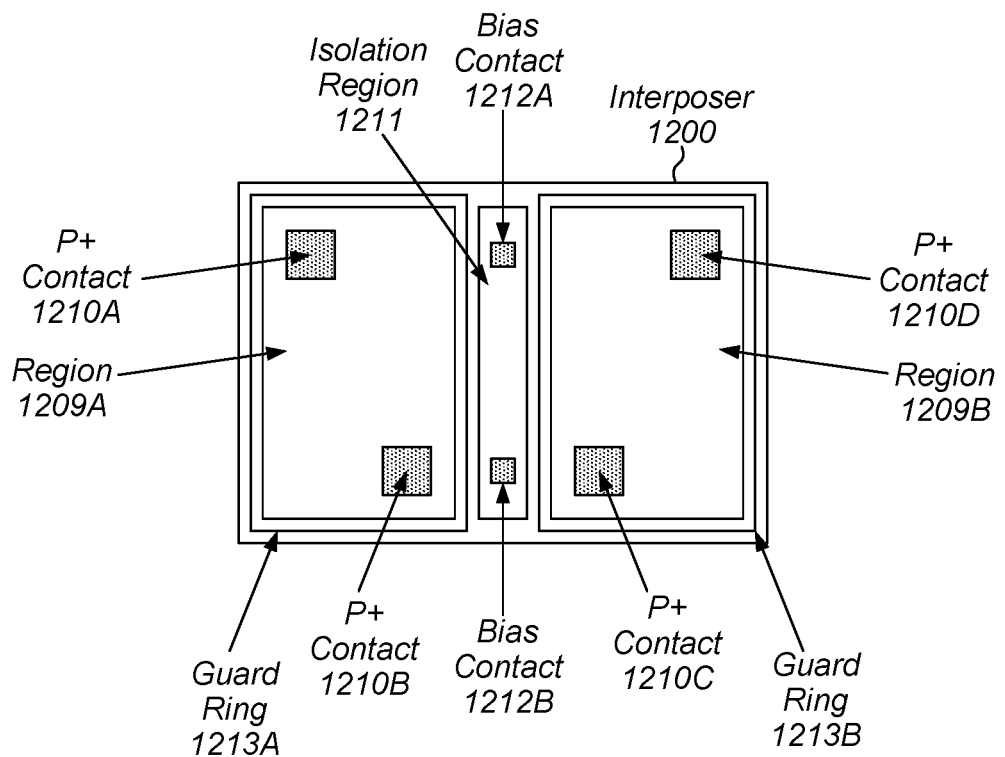
FIG. 12B is a block diagram of illustrating a top view of a section of an interposer for use in a package system.

FIG. 12B depicts a top view of interposer 1200 that includes regions 1209A-B, P+ contacts 1210A-D, isolation region 1211, bias contacts 1212A-B, and guard rings 1213A-B. In various embodiments, P+ contacts 1210A and 1210B provide connections to P+ materials 1205A, and P+ contacts 1210C and 1210D provide connections to P+ material 1205B. As described above, the voltage level applied to P+ contacts 1210A and 1210B may be different than the voltage level applied to P+ contacts 1210C and 1210D.

Since region 1209A may be at a different voltage level than region 1209B, a risk of latch-up can exist. To remediate the risk, the space between regions 1209A and 1209B may be increased. Alternatively, or additionally, isolation region 1211 in conjunction with guard rings 1213A-B may be employed. In various embodiments, isolation region 1211 may correspond to pocket 1202, and guard rings 1213A-B may correspond to pockets 1208A-B, respectively. As noted above, bias contacts 1212A-B may be used to enhance the isolation effect provided by isolation region 1211. For example, in some cases, a voltage level at ground potential or slightly below ground potential may be applied to bias contacts 1212A-B. It is noted that each of guard rings 1213A-B may be coupled to a DC voltage level different than the voltage level applied to bias contacts 1212A-B as well those applied to regions 1209A-B.

Although two P+ contacts to region 1209A and two P+ contacts to region 1209B are depicted in the embodiment of FIG. 12B, in other embodiments, any suitable number of P+ contacts to each region may be employed. For example, additional P+ contacts may be employed to reduce the resistance in series with regions 1209A-B. In a similar fashion, additional bias contacts may be applied to reduce the resistance in series with isolation region 1211.

In some integrated circuits, different circuits or circuit blocks may operate using different power supply voltage levels. In such cases, multiple voltage regulator circuits or power converter circuits may be employed to generate the desired power supply voltage levels or corresponding power supply nodes. In additional to using multiple voltage regulator circuits and power converter circuits, multiple decoupling circuits may be attached to the different power supply nodes to reduce voltage droop on the power supply nodes.

It is noted that depending on the nominal and operating voltage levels of the different power supply nodes, electrical characteristics (e.g., cut-in voltage) may be adjusted as described above.

Figure 13:
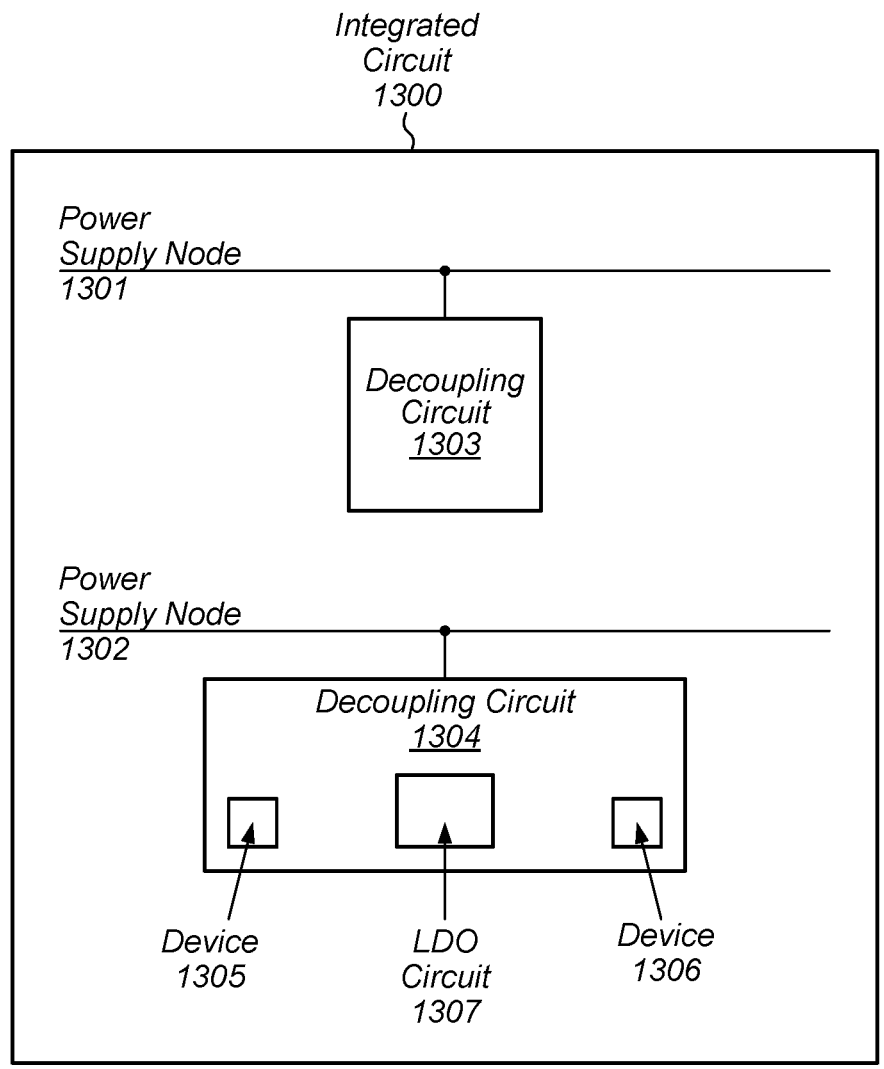
FIG. 13 is a block diagram of a computer system that includes multiple decoupling circuits.

Turning to FIG. 13, a block diagram of an embodiment of an integrated circuit with multiple power supply nodes is depicted. As illustrated, integrated circuit 1300 includes decoupling circuit 1303 and decoupling circuit 1304. Although only two decoupling circuits are depicted in the embodiment of FIG. 13, in other embodiments may include any suitable number of decoupling circuits.

Decoupling circuit 1303 is coupled to power supply node 1301. In various embodiments, decoupling circuit 1303 may correspond to either of decoupling circuits 100 or 200 as depicted in FIGS. 1 and 2, respectively.

Decoupling circuit 1304 is coupled to power supply node 1302. It is noted that both the nominal and operating voltage levels of power supply node 1302 may be different than those for power supply node 1301. In various embodiments, decoupling circuit 1304 may include at least one diode or bipolar device configured to source previously stored charge to power supply node 1301 during voltage droop events.

Decoupling circuit 1304 includes devices 1305 and 1306, and optionally includes LDO circuit 1307. In various embodiments, devices 1305 and 1306 may correspond to diode 103. In some cases, one or both of devices 1305 and 1306 may be implemented using bipolar transistors as described above. Devices 1305 and 1306 may, in some embodiments, be charged in parallel and then discharged in series to provide support for higher voltages on power supply node 1302. LDO circuit 1307 may be employed, in various embodiments, to source additional current to power supply node 1302 during voltage droop events. In some cases, the use of LDO circuit 1307 may be dynamic based on the rate of change on power supply node 1302.

In some cases, circuit blocks within an integrated circuit may be shut down when not in use in order to reduce power dissipation and conserve battery life in mobile computing applications. A circuit block may be shut down by disabling one or more clock signals used by the circuit block. Alternatively, or additionally, a connection to the power supply for the circuit block may be broken in a process referred to as "power gating." During power gating, one or more devices (e.g., MOSFETs) coupled in series between a power converter circuit or a voltage regulator circuit and the circuit block are deactivated, effectively floating the local power supply nodes in the circuit block.

Figure 14:
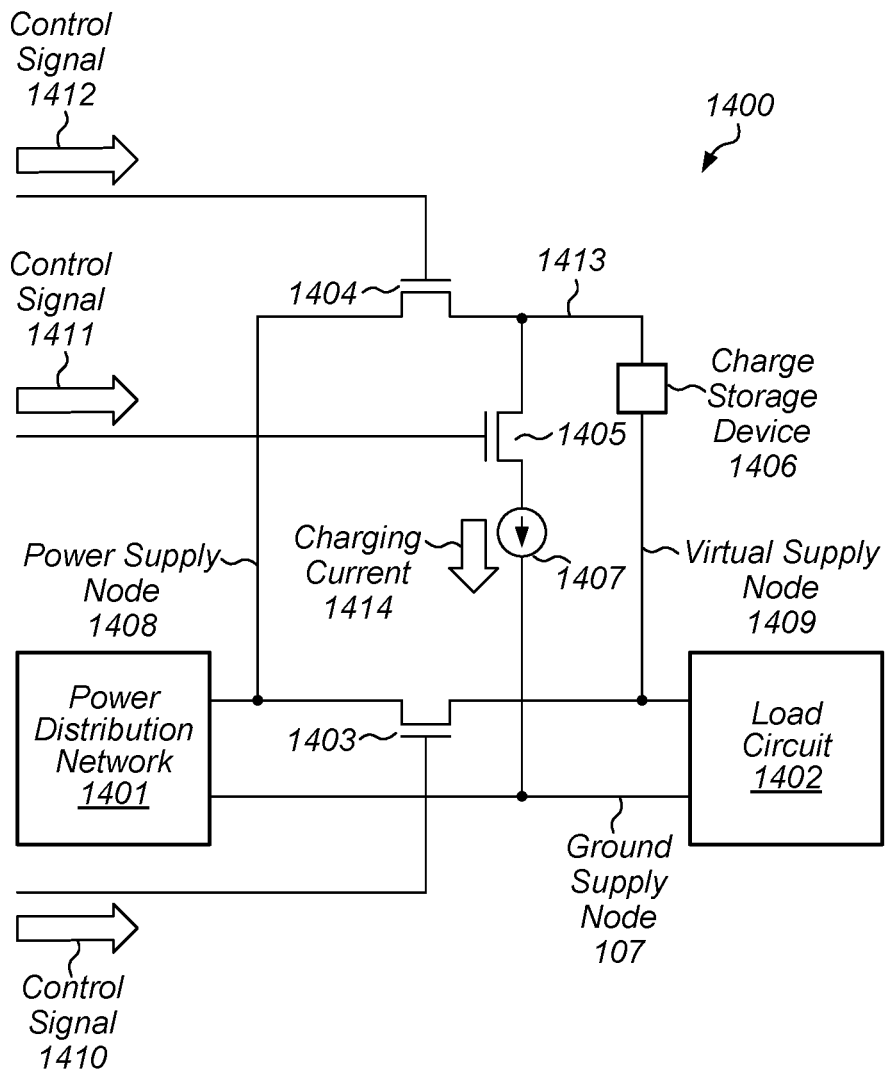
FIG. 14 is a block diagram of a power gating system that includes a boost circuit that employs a charge reverse recovery device.

Turning to FIG. 14, a block diagram of a power gating system with boost capability is depicted. As illustrated, power gate circuit 1400 includes power distribution network 1401, load circuit 1402, devices 1403-1405, charge storage device 1406, and current source 1407.

Power distribution network 1401 is coupled to ground supply node 107, and is configured to generate a particular voltage level on power supply node 1408. In various embodiments, power distribution network 1401 may include one or more power converter circuits and/or voltage regulator circuits, at least one of which is configured to generate the particular voltage on power supply node 1408 using an input power supply (not shown). In some cases, the power converter circuits and/or voltage regulator circuits may be located on a different integrated circuit from load circuit 1402. In such situations, power distribution network 1401 may include an interposer (e.g., interposer 1200), that includes wiring to transfer the generated voltage from one integrated circuit to another. In some embodiments, the interposer may optionally include decoupling circuits as described above. Although power distribution network 1401 is depicted as generating a particular voltage level on a single power supply node, in other embodiments, power distribution network 1401 may generate respective voltage levels on any suitable number of power supply nodes.

Load circuit 1402 is coupled to virtual supply node 1409 and ground supply node 107. As used and described herein, a virtual supply node refers to a circuit node within a computer system that provides power to a load circuit, but can be allowed to float during a power gating operation. Load circuit 1402 may be any sort of suitable circuit, such as a processor circuit, a processor core, a memory circuit, and the like.

Device 1403 is coupled between power supply node 1408 and virtual supply node 1409 and is configured to couple (and de-couple) power supply node 1408 to (or from) virtual supply node 1409 using control signal 1410. For example, in response to an activation of control signal 1410, device 1403 is configured to couple power supply node 1408 to virtual supply node 1409. In response to a de-activation of control signal 1410, device 1403 is configured to de-couple power supply node 1408 from virtual supply node 1409. It is noted that control signal 1410 may be generated by a power management unit (referred to as a "PMU") or other power control circuit configured to manage power operations within an integrated circuit. For example, a PMU may be configured to initiate a power gating operation for load circuit 1402 in response to a determination that load circuit 1402 is not scheduled to perform any operations for a particular period of time.

Device 1404 is coupled between power supply node 1408 and node 1413, and is configured to couple power supply node 1408 to node 1413 using control signal 1412. In various embodiments, control signal 1412 may have similar polarity and timing as control signal 1410.

Charge storage device 1406 is coupled between node 1413 and virtual supply node 1409. In various embodiments, charge storage device 1406 may correspond to diode 103, or a bipolar device as described above. Charge storage device 1406 is configured to source charge to virtual supply node 1409 in response to a detection of a voltage droop on virtual supply node 1409, functioning in a similar fashion to a micro-battery. In some cases, frequent power gating operations can result in the voltage level on virtual supply node 1409 not being able to reach a desired level, creating a voltage droop. In such cases, charge storage device 1406 is able to provide additional charge to virtual supply node 1409 to help charge virtual supply node 1409 to its desired level. Although only a single charge storage device is depicted in the embodiment of FIG. 14, in other embodiments, any suitable number of charge storage devices may be employed.

Device 1405 is coupled between node 1413 and current source 1407, which is, in turn, coupled to ground supply node 107. In various embodiments, device 1405 is configured to couple (or de-couple) current source 1407 to (or from) node 1413 using control signal 1411. For example, during a power gating operation, control signal 1411 may be activated to allow charging current 1414 to store charge in charge storage device 1406. In various embodiments, control signal 1411 may have similar timing to control signals 1410 and 1412, but have an opposite polarity.

Current source 1407 is configured to generate charging current 1414 which is used to store charge in charge storage device 1406 during power gating operations. In various embodiments, current source 1407 may be implemented using a supply-independent bias circuit along with one or more current mirror circuits.

In various embodiments, devices 1403-1405 may be implemented as n-channel MOSFETs, FinFETs, GAAFETs, or any other suitable switching devices. Although devices 1403-1405 are depicted as being single devices, in other embodiments, each may include multiple devices. For example, device 1403 may be implemented as multiple n-channel MOSFETs, or a combination of n-channel and p-channel MOSFETs arranged as a pass-gate circuit.

In some computer systems, multiple integrated circuits are coupled together via a common interconnect device. The interconnect device can not only supply wiring for power supplies, but also for the transmission of data between the integrated circuits. Data may be transmitted from one integrated circuit to another using various communication protocols. For example, data may be transmitted using a return to zero (RZ) protocol, a non-return to zero (NRZ) protocol, a pulse-amplitude modulation (PAM) protocol, or any other suitable communication protocol. Such communication protocols may make use of power supply signals as part of the protocol, or as shields between other signals to reduce capacitive and inductive coupling. In various embodiments, decoupling systems (e.g., decoupling system 100) may be employed in the interconnect device to improve the quality of signals transmitted between the integrated circuits.

Figure 15A:
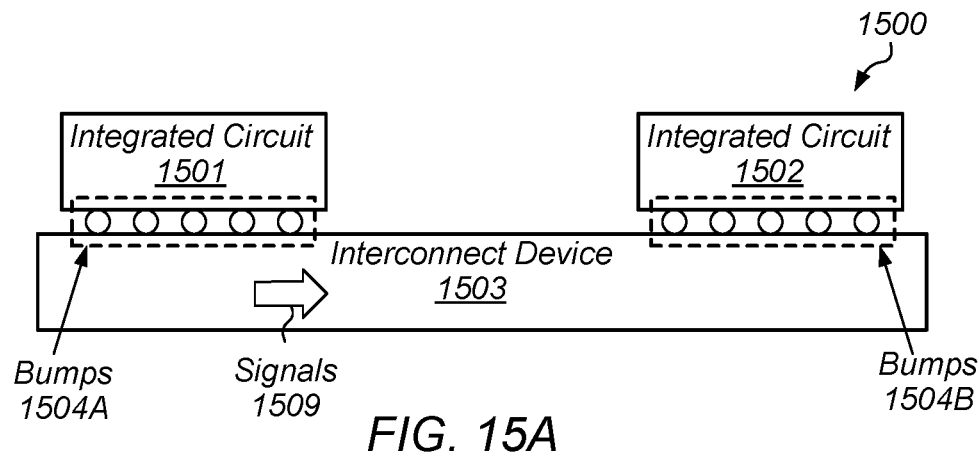
FIG. 15A is a block diagram of a system that includes two integrated circuits coupled to a common interconnect device.

Turning to FIG. 15A, a block diagram of a system that includes multiple integrated circuits coupled to a common interconnect device is depicted. As illustrated, system 1500 includes integrated circuit 1501, integrated circuit 1502, and interconnect device 1503. Integrated circuits 1501 and 1502 may be systems-on-a-chip configured to perform a variety of functions and operations. Although only two integrated circuits are depicted as being coupled to interconnect device 1503, in other embodiments, any suitable number of integrated circuits may be coupled to interconnect device 1503.

Integrated circuit 1501 is coupled to interconnect device 1503 via bumps 1504A. In a similar fashion, integrated circuit 1502 is coupled to interconnect device 1503 via bumps 1504B. In various embodiments, bumps 1504A-B may be implemented as either micro-bumps, hybrid bumps, or any other suitable bump technology.

Integrated circuit 1501 is configured to send data to integrated circuit 1502 using signals 1509. In various embodiments, signals 1509 may conform to any suitable communication protocol standard, and may propagate from integrated circuit 1501 to integrated circuit 1502 via wire traces included in interconnect device 1503.

Figure 15B:
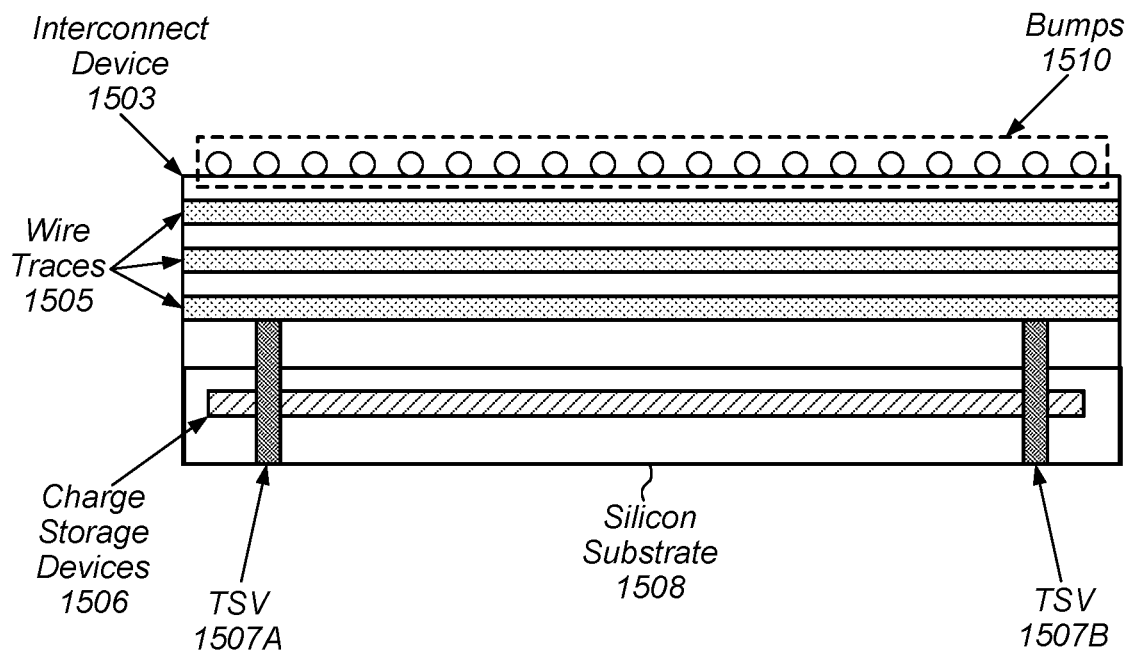
FIG. 15B is a block diagram of a common interconnect device that includes devices for a decoupling system.

Turning to FIG. 15B, a block diagram depicting a cross-section of interconnect device 1503 is depicted. As illustrated, interconnect device 1503 includes bumps 1510, wire traces 1505, charge storage devices 1506, two through-silicon vias (denoted "TSV 1507A" and "TSV 1507B"), and silicon substrate 1508.

In various embodiments, bumps 1510 may correspond to either of bumps 1504A or bumps 1504B. Any of bumps 1510 may be coupled to one of wire traces 1505 using one or more vias (not shown). Wire traces 1505 may be implemented using aluminum, copper, or any other suitable metal, and may include power and ground planes in addition to signal wires. Although only three wire traces are depicted in the embodiment of FIG. 15B, in other embodiments, any suitable number of wire traces may be employed.

Charge storage devices 1506 includes multiple diodes (e.g., diode 103), BJTs, and any other suitable devices that are configured to store charge during a charge phase and supply charge to a one or more of wire traces 1505 during a boost mode or phase. In some embodiments, charge storage devices 1506 are fabricated into silicon substrate 1508 using structures similar to those described above. In various embodiments, charge storage devices 1506 are coupled to the one or more of wire traces 1505 using TSV 1507A and TSV 1507B. In some cases, particular ones of charge storage devices 1506 are coupled to particular ones of wire traces 1505 that are used as power supply nodes. Although only two through-silicon vias are depicted in the embodiment of FIG. 15B, in other embodiments, any suitable number of through-silicon vias may be employed.

Figure 16:
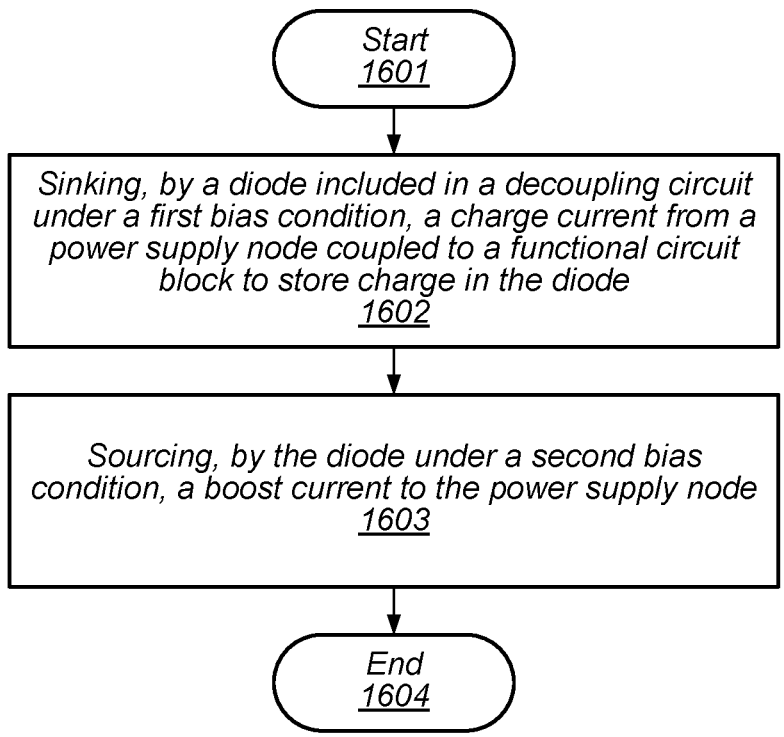
FIG. 16 illustrates a flow diagram depicting an embodiment of a method for operating a decoupling circuit in continuous mode.

As mentioned above, decoupling circuits may be operated in either continuous mode or switch mode. A flow diagram depicting an embodiment of a method for operating a decoupling circuit in continuous mode is illustrated in FIG. 16. The method, which may be applied to various decoupling circuits, such as decoupling circuit 102, begins in block 1601.

The method includes sinking, by a diode included in a decoupling circuit under a first bias condition, a charge current from a power supply node coupled to a functional circuit block to store charge in the diode (block 1602). The diode may, in some embodiments, include an undoped intrinsic semiconductor region coupled between a p-type semiconductor region and an n-type semiconductor region. As used and defined herein, undoped intrinsic semiconductor refers to material that is not intentionally doped to become either p-type or n-type material, but may still include a slight amount of p-type or n-type dopant atoms. In other embodiments, the decoupling circuit may further include a capacitor coupled, in parallel, to the diode.

The method further includes sourcing, by the diode under a second bias condition, a boost current to the power supply node (block 1603). In various embodiments, the first bias condition may include a forward bias condition for the diode, and the second bias condition may include a reverse bias condition for the diode. In other embodiments, both the first bias condition and the second bias condition may be based on a voltage level of the power supply node. The method ends in block 1604.

Figure 17:
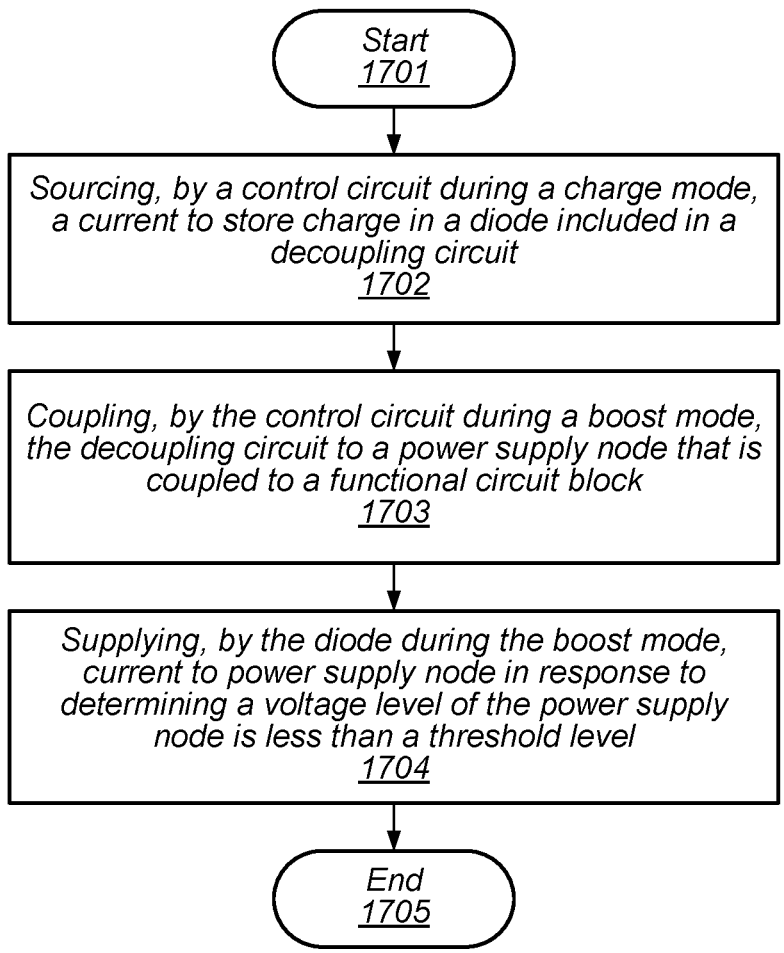
FIG. 17 illustrates a flow diagram depicting an embodiment of a method for operating a decoupling circuit in switched mode.

Turning to FIG. 17, a flow diagram depicting an embodiment of a method for operating a decoupling circuit in switch mode is illustrated. The method, which may be applied to various decoupling circuits, such as decoupling circuit 102, begins in block 1701.

The method includes sourcing, by a control circuit during a charge mode, a current to store charge in a diode included in a decoupling circuit (block 1702). The diode may, in some embodiments, include an undoped intrinsic semiconductor region coupled between a p-type semiconductor region and an n-type semiconductor region. In other embodiments, the decoupling circuit may further include a capacitor coupled, in parallel, to the diode.

In various embodiments, a cathode of the diode is coupled to a ground supply node, and sourcing, by the control circuit during the charge mode, the current to the diode includes coupling a current source to an anode of the diode. In some embodiments, a duration of the charge mode is based on an amount of charge recombination in the diode.

The method further includes coupling, by the control circuit during a boost mode, the decoupling circuit to a power supply node that is coupled to a functional circuit block (block 1703). In some embodiments, coupling, by the control circuit during the boost mode, the decoupling circuit to the power supply node includes opening a first switch coupled between the current source and the anode of the diode, and closing a second switch coupled between the power supply node and the anode of the diode. In other embodiments, the method further includes activating the boost mode in response to detecting a transient in a voltage level of the power supply node.

The method also includes supplying, by the diode during the boost mode, current to the power supply node in response to determining a voltage level of the power supply node is less than a threshold level (block 1704). The method concludes in block 1705.

Figure 18:
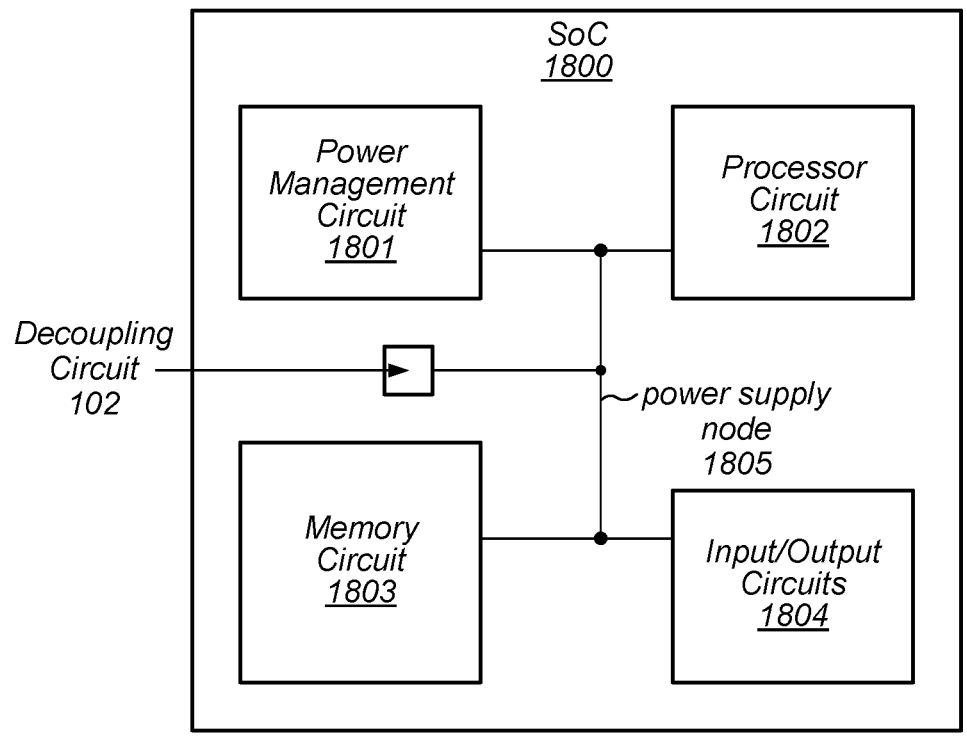
FIG. 18 is a block diagram of a system-on-a-chip.

A block diagram of a system-on-a-chip (SoC) is illustrated in FIG. 18. In the illustrated embodiment, SoC 1800 includes power management circuit 1801, processor circuit 1802, memory circuit 1803, and input/output circuits 1804, each of which is coupled to power supply node 1805. Decoupling circuit 102 is also coupled to power supply node 1805. It is noted that although only a single power supply node and a single decoupling circuit are depicted in FIG. 18, in other embodiments, multiple power supply nodes and multiple decoupling circuits may be employed.

Power management circuit 1801 is configured to generate a regulated voltage level on power supply node 1805 in order to provide power to processor circuit 1802, input/output circuits 1804, and memory circuit 1803. In various embodiments, power management circuit 1801 may include one or more power converter or voltage regulator circuits. Although power management circuit 1801 is depicted as being included in SoC 1800, in other embodiments, all or a portion of power management circuit 1801 may be located on a different integrated circuit than SoC 1800.

Processor circuit 1802 may, in various embodiments, be representative of a general-purpose processor that performs computational operations. For example, processor circuit 1802 may be a central processing unit (CPU) such as a microprocessor, a microcontroller, an application-specific integrated circuit (ASIC), or a field-programmable gate array (FPGA).

Memory circuit 1803 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 18, in other embodiments, any suitable number of memory circuits may be employed.

Input/output circuits 1804 may be configured to coordinate data transfer between SoC 1800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1804 may be configured to implement a version of Universal Serial Bus (USB) protocol or IEEE 1394 (Firewire®) protocol.

Input/output circuits 1804 may also be configured to coordinate data transfer between SoC 1800 and one or more devices (e.g., other computing systems or integrated circuits) coupled to SoC 1800 via a network. In one embodiment, input/output circuits 1804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1804 may be configured to implement multiple discrete network interface ports.

Figure 19:
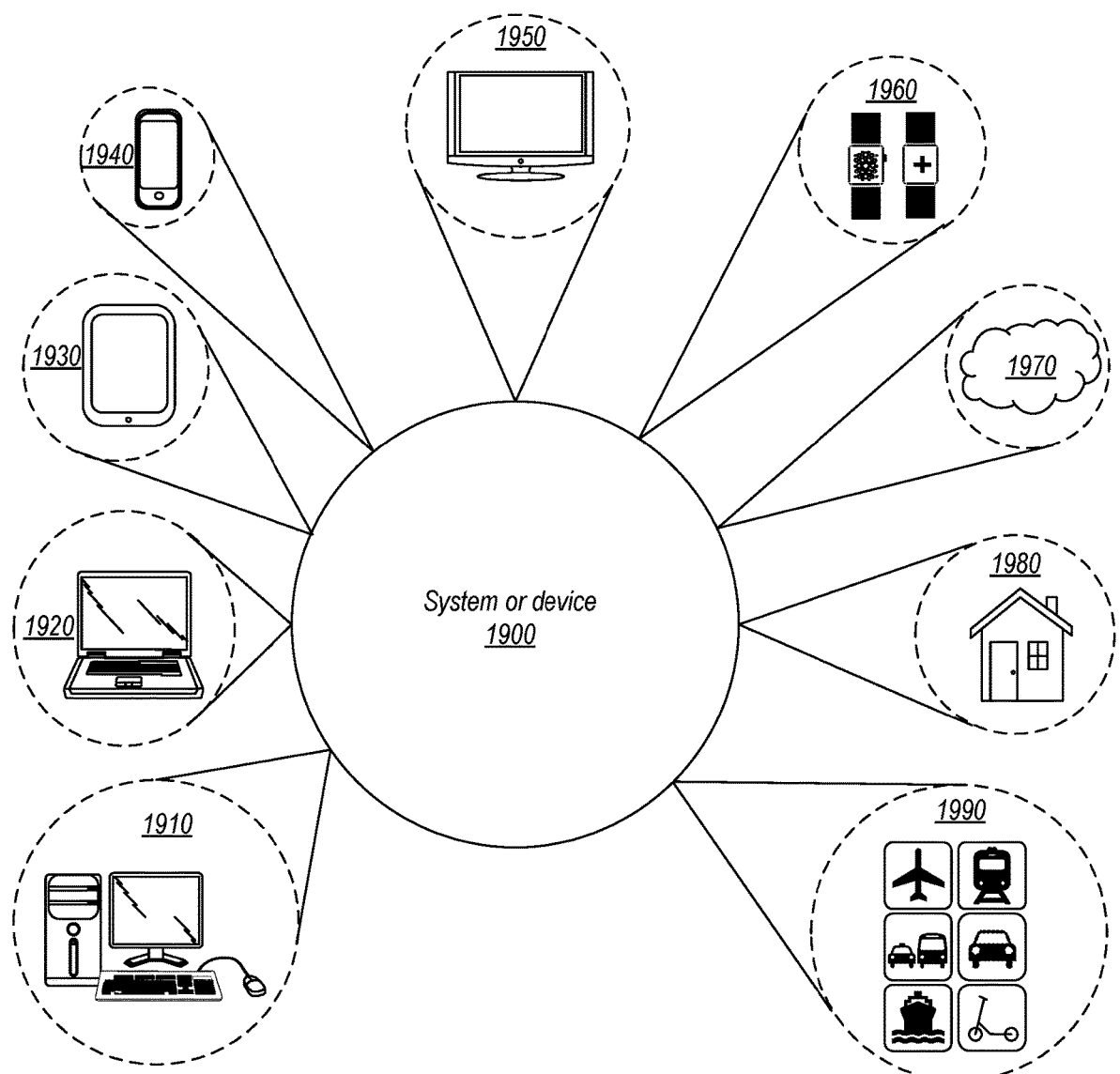
FIG. 19 is a block diagram of an embodiment of a system.

Turning now to FIG. 19, various types of systems that may include any of the circuits, devices, or systems discussed above are illustrated. System or device 1900, which may incorporate or otherwise utilize one or more of the techniques described herein, may be utilized in a wide range of areas. For example, system or device 1900 may be utilized as part of the hardware of systems such as a desktop computer 1910, laptop computer 1920, tablet computer 1930, cellular or mobile phone 1940, or television 1950 (or set-top box coupled to a television).

Similarly, disclosed elements may be utilized in a wearable device 1960, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 1900 may also be used in various other contexts. For example, system or device 1900 may be utilized in the context of a server computer system, such as a dedicated server or on shared hardware that implements a cloud-based service 1970. Still further, system or device 1900 may be implemented in a wide range of specialized everyday devices, including devices 1980 commonly found in the home such as refrigerators, thermostats, security cameras, etc. The interconnection of such devices is often referred to as the "Internet of Things" (IoT). Elements may also be implemented in various modes of transportation. For example, system or device 1900 could be employed in the control systems, guidance systems, entertainment systems, etc. of various types of vehicles 1990.

The applications illustrated in FIG. 19 are merely exemplary and are not intended to limit the potential future applications of disclosed systems or devices. Other example applications include, without limitation: portable gaming devices, music players, data storage devices, unmanned aerial vehicles, etc.

Figure 20:
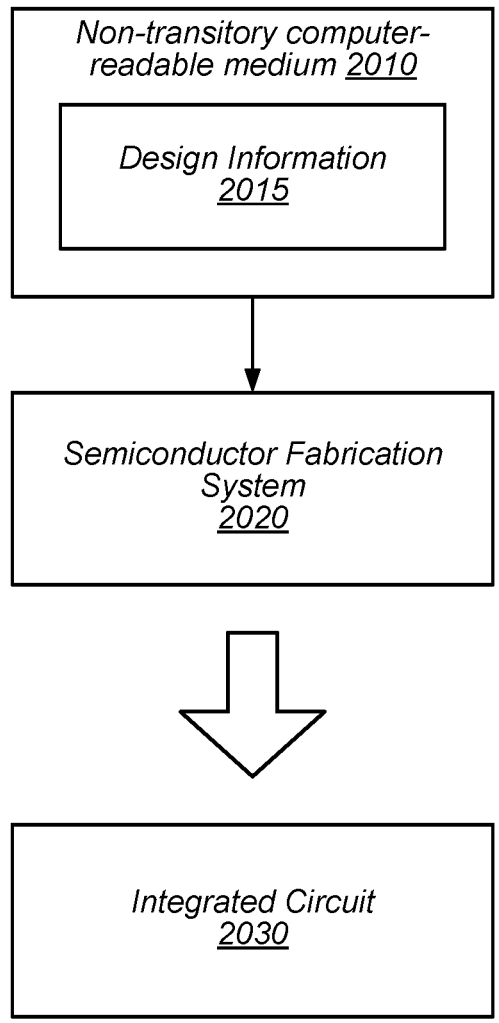
FIG. 20 illustrates an example of a non-transitory computer-readable storage medium that stores circuit design information.

FIG. 20 is a block diagram illustrating an example of a non-transitory computer-readable storage medium that stores circuit design information, according to some embodiments. In the illustrated embodiment, semiconductor fabrication system 2020 is configured to process the design information 2015 stored on non-transitory computer-readable storage medium 2010 and fabricate integrated circuit 2030 based on the design information 2015.

Non-transitory computer-readable storage medium 2010 may comprise any of various appropriate types of memory devices or storage devices. Non-transitory computer-readable storage medium 2010 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 2010 may include other types of non-transitory memory as well, or combinations thereof. Non-transitory computer-readable storage medium 2010 may include two or more memory mediums, which may reside in different locations, e.g., in different computer systems that are connected over a network.

Design information 2015 may be specified using any of various appropriate computer languages, including hardware description languages such as, without limitation: VHDL, Verilog, SystemC, SystemVerilog, RHDL, M, MyHDL, etc. Design information 2015 may be usable by semiconductor fabrication system 2020 to fabricate at least a portion of integrated circuit 2030. The format of design information 2015 may be recognized by at least one semiconductor fabrication system, such as semiconductor fabrication system 2020, for example. In some embodiments, design information 2015 may include a netlist that specifies elements of a cell library, as well as their connectivity. One or more cell libraries used during logic synthesis of circuits included in integrated circuit 2030 may also be included in design information 2015. Such cell libraries may include information indicative of device or transistor level netlists, mask design data, characterization data, and the like, of cells included in the cell library.

Integrated circuit 2030 may, in various embodiments, include one or more custom macrocells, such as memories, analog or mixed-signal circuits, and the like. In such cases, design information 2015 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 2020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 2020 may also be configured to perform various testing of fabricated circuits for correct operation.

In various embodiments, integrated circuit 2030 is configured to operate according to a circuit design specified by design information 2015, which may include performing any of the functionality described herein. For example, integrated circuit 2030 may include any of various elements shown or described herein. Further, integrated circuit 2030 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus comprising:
   a power distribution network including at least one power supply circuit configured to generate a power supply voltage on a power supply node;
   a current source configured to generate a first charge current;

a first diode configured to store charge using the first charge current, wherein the first diode is coupled to a virtual supply node, wherein the first diode is configured to, in response to a decrease in a voltage level of the virtual supply node, source charge to the virtual supply node;

a control circuit configured to:
during a first mode of operation, couple the power supply node to the virtual supply node and a load circuit; and
during a second mode of operation, decouple the power supply node from the load circuit and the virtual supply node and couple the current source to charge the first diode using the first charge current.

2. The apparatus of claim 1, further comprising:
a first switch configured to, when activated, couple the power supply node to the virtual supply node;
a second switch configured to, when activated, couple the power supply node to a first terminal of the first diode, wherein a second terminal of the first diode is coupled to the virtual supply node; and
a third switch, configured to, when activated, couple the current source to the first terminal of the first diode.

3. The apparatus of claim 2, wherein the control circuit is configured to:
during the first mode of operation and using first and second control signals, respectively, activate the first and second switches while deactivating the third switch using a third control signal; and
during the second mode of operation, activate the third switch using the third control signal and deactivate the first and second switches using the first and second control signals, respectively.

4. The apparatus of claim 1 wherein the power distribution network is implemented on a first integrated circuit, and wherein the load circuit is implemented on a second integrated circuit.

5. The apparatus of claim 4, wherein the first and second integrated circuits are mounted on an interposer, wherein the interposer includes a second diode configured to: sink, under a first bias condition, a second charge current from the power supply node; and source, under a second bias condition, a transient boost current to the power supply node.

6. The apparatus of claim 5, wherein the second bias condition comprises a decrease in a voltage level on the power supply node.

7. The apparatus of claim 1, wherein the first diode includes an intrinsic semiconductor region coupled between a $p^+$-type semiconductor region and an n-type semiconductor region.

8. The apparatus of claim 7, further comprising a first plurality of contacts coupled to the $p^+$-type semiconductor region and a second plurality of contacts coupled to the $n^+$-type semiconductor region.

9. The apparatus of claim 1, further comprising one or more additional diodes coupled in parallel with the first diode.

10. A method comprising:
providing, from a power distribution network having at least one power supply circuit, a power supply voltage on a power supply node;
generating, using a current source, a first charge current;
storing charge using a first diode coupled to receive the first charge current;
sourcing charge, from the first diode to a virtual supply node, in response to a decrease in a voltage level of the virtual supply node, source charge to the virtual supply node;
coupling, using a control circuit and during a first mode of operation, the power supply node to the virtual supply node and a load circuit;
decoupling, using the control circuit and during a second mode of operation, the power supply node from the load circuit and the virtual supply node; and
charging, during the second mode of operation, the first diode using the first charge current.

11. The method of claim 10, further comprising:
activating a first switch, during operation in the first mode, to couple the power supply node to the virtual supply node;
activating a second switch, during operation in the first mode, to couple the power supply node to a first terminal of the first diode, wherein a second terminal of the first diode is coupled to the virtual supply node; and
activating a third switch, during operation in the second mode, to couple the current source to the first terminal of the first diode;
wherein operation in the first mode further comprises deactivating the third switch, and wherein operation in the second mode further comprises deactivating the first and second switches.

12. The method of claim 11, further comprising sourcing charge from one or more additional diodes to the virtual supply node in response to the decrease in the voltage level of the virtual supply node, wherein the one or more additional diodes are coupled in parallel with the first diode.

13. The method of claim 10, wherein the power distribution network is implemented on a first integrated circuit, and wherein the method further comprises the power distribution network conveying the power supply voltage to a second integrated circuit, wherein the load circuit is implemented on the second integrated circuit.

14. The method of claim 13, further comprising:
sinking, using a second diode and under a first bias condition, a second charge current from the power supply node; and
sourcing, using the second diode and under a second bias condition, a transient boost current to the power supply node;
wherein the first and second integrated circuits are mounted on an interposer that includes the second diode.

15. The method of claim 14, wherein the second bias condition comprises a decrease in a voltage level on the power supply node.

16. A system comprising:
an interposer;
a first integrated circuit mounted on the interposer, wherein the first integrated circuit includes a power distribution network including at least one power supply circuit configured to generate a power supply voltage on a power supply node;
a second integrated circuit mounted on the interposer, wherein the second integrated circuit includes a load circuit coupled to receive the power supply voltage via the power supply node;
a first diode configured to store charge using a first charge current, wherein the first diode is coupled to a virtual supply node, wherein the first diode is configured to, in response to a decrease in a voltage level of the virtual supply node, source charge to the virtual supply node;

a control circuit configured to:
  during a first mode of operation, couple the power supply node to the virtual supply node and the load circuit; and
  during a second mode of operation, decouple the power supply node from the load circuit and the virtual supply node and cause a current source to charge the first diode using the first charge current.

17. The system of claim 16, further comprising a second diode, wherein the second diode is configured to:
  sink, under a first bias condition, a second charge current from the power supply node; and
  source, under a second bias condition, a transient boost current to the power supply node.

18. The system of claim 17, wherein the second diode is integrated into the interposer.

19. The system of claim 16, wherein the first diode includes:
  an intrinsic semiconductor region coupled between a p$^+$-type semiconductor region and an n$^+$-type semiconductor region;
  a first plurality of contacts coupled to the p$^+$-type semiconductor region; and
  a second plurality of contacts coupled to the n$^+$-type semiconductor region.

20. The system of claim 16, further comprising:
  a first switch configured to, when activated, couple the power supply node to the virtual supply node;
  a second switch configured to, when activated, couple the power supply node to a first terminal of the first diode, wherein a second terminal of the first diode is coupled to the virtual supply node; and
  a third switch, configured to, when activated, couple the current source to the first terminal of the first diode;
  wherein the control circuit is further configured to:
    during the first mode of operation and using first and second control signals, respectively, activate the first and second switches while deactivating the third switch using a third control signal; and
    during the second mode of operation, activate the third switch using the third control signal and deactivate the first and second switches using the first and second control signals, respectively.

* * * * *